(12) United States Patent
Leidy et al.

(10) Patent No.: US 9,231,089 B2
(45) Date of Patent: Jan. 5, 2016

(54) FORMATION OF AN ASYMMETRIC TRENCH IN A SEMICONDUCTOR SUBSTRATE AND A BIPOLAR SEMICONDUCTOR DEVICE HAVING AN ASYMMETRIC TRENCH ISOLATION REGION

(71) Applicant: International Business Machines Corporation, Armonk, NY (US)

(72) Inventors: Robert K. Leidy, Burlington, VT (US); Mark D. Levy, Milton, VT (US); Qizhi Liu, Lexington, MA (US); Gary L. Milo, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/694,359

(22) Filed: Apr. 23, 2015

(65) Prior Publication Data

US 2015/0228769 A1 Aug. 13, 2015

Related U.S. Application Data

(62) Division of application No. 14/083,774, filed on Nov. 19, 2013, now Pat. No. 9,059,233.

(51) Int. Cl.
*H01L 29/737* (2006.01)
*H01L 29/04* (2006.01)
(Continued)

(52) U.S. Cl.
CPC .............. *H01L 29/737* (2013.01); *H01L 29/04* (2013.01); *H01L 29/045* (2013.01);
(Continued)

(58) Field of Classification Search
CPC ............... H01L 21/3083; H01L 21/30604; H01L 21/30608; H01L 29/0649; H01L 29/7371; H01L 29/66242
See application file for complete search history.

(56) References Cited

U.S. PATENT DOCUMENTS 6,596,616 B1 7/2003 Holm et al.
7,528,045 B2 5/2009 Wu et al.
(Continued)

OTHER PUBLICATIONS

U.S. Appl. No. 14/083,774, Restriction Requirement dated Jan. 6, 2015, 7 pages.

(Continued)

*Primary Examiner* — Tan N Tran
*Assistant Examiner* — Fazli Erdem
(74) *Attorney, Agent, or Firm* — Gibb & Riley, LLC; Steven Meyers, Esq.

(57) ABSTRACT

Disclosed is a trench formation technique wherein an opening having a first sidewall with planar contour and a second sidewall with a saw-tooth contour is etched through a semiconductor layer and into a semiconductor substrate. Then, a crystallographic wet etch process expands the portion of the opening within the semiconductor substrate to form a trench. Due to the different contours of the sidewalls and, thereby the different crystal orientations, one sidewall etches faster than the other, resulting in an asymmetric trench. Also disclosed is a bipolar semiconductor device formation method that incorporates the above-mentioned trench formation technique when forming a trench isolation region that undercuts an extrinsic base region and surrounds a collector pedestal. The asymmetry of the trench ensures that the trench isolation region has a relatively narrow width and, thereby ensures that both collector-to-base capacitance $C_{cb}$ and collector resistance $R_c$ are minimized within the resulting bipolar semiconductor device.

20 Claims, 16 Drawing Sheets

(51) Int. Cl.
*H01L 29/16* (2006.01)
*H01L 29/161* (2006.01)
*H01L 29/165* (2006.01)
*H01L 29/06* (2006.01)
*H01L 29/08* (2006.01)

(52) U.S. Cl.
CPC ....... *H01L 29/0649* (2013.01); *H01L 29/0826* (2013.01); *H01L 29/16* (2013.01); *H01L 29/161* (2013.01); *H01L 29/165* (2013.01); *H01L 29/1608* (2013.01)

(56) References Cited

U.S. PATENT DOCUMENTS

| | | | |
|---|---|---|---|
| 7,989,319 B2 | 8/2011 | Grivna et al. | |
| 8,084,865 B2 | 12/2011 | Hirler et al. | |
| 8,455,317 B2 | 6/2013 | Shin et al. | |
| 8,796,149 B1 | 8/2014 | Adkisson et al. | |
| 2007/0126080 A1* | 6/2007 | Wallner et al. | 257/565 |
| 2007/0166900 A1 | 7/2007 | Li et al. | |
| 2007/0298578 A1 | 12/2007 | Khater et al. | |
| 2010/0090278 A1 | 4/2010 | Rohrer | |
| 2014/0151852 A1* | 6/2014 | Adkisson et al. | 257/565 |
| 2014/0217551 A1 | 8/2014 | Dunn et al. | |
| 2014/0231877 A1 | 8/2014 | Adkisson et al. | |
| 2014/0284758 A1 | 9/2014 | Harame et al. | |
| 2014/0327106 A1 | 11/2014 | Liu | |
| 2014/0327111 A1* | 11/2014 | Camillo-Castillo et al. | 257/586 |
| 2014/0353725 A1* | 12/2014 | Adkisson et al. | 257/197 |

OTHER PUBLICATIONS

U.S. Appl. No. 14/083,774, Notice of Allowance dated Mar. 23, 2015, 9 pages.

* cited by examiner

US 9,231,089 B2

FORMATION OF AN ASYMMETRIC TRENCH IN A SEMICONDUCTOR SUBSTRATE AND A BIPOLAR SEMICONDUCTOR DEVICE HAVING AN ASYMMETRIC TRENCH ISOLATION REGION

CROSS-REFERENCE TO RELATED APPLICATIONS

This application is a Divisional of U.S. application Ser. No. 14/083,774 filed Nov. 19, 2013, the complete disclosure of which, in its entirety, is herein incorporated by reference.

BACKGROUND

The methods and structures disclosed herein are related to trenches for use, for example, in trench isolation regions of semiconductor devices (e.g., for bipolar semiconductor devices, such as bipolar junction transistors (BJTs) or heterojunction bipolar transistors (HBTs)) and, particularly, to a method of forming an asymmetric trench, to a method of forming a bipolar semiconductor device having an asymmetric trench isolation region and to the resulting bipolar semiconductor device structure.

Those skilled in the art will recognize that it is desirable in bipolar semiconductor devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic capacitances and resistances including, but are not limited to, parasitic collector-to-base capacitance $C_{cb}$ and parasitic collector resistance $R_c$. Reduction of the parasitic capacitances and resistances can result in a higher $f_{max}$. Thus, it would be advantageous to provide an improved bipolar semiconductor device, such as a bipolar junction transistor (BJT) or heterojunction bipolar transistor (HBT), in which collector-to-base capacitance $C_{cb}$ and collector resistance $R_c$ are both minimized as well as a method of forming such an improved bipolar semiconductor device.

SUMMARY

In view of the foregoing, disclosed herein is an improved technique for forming an asymmetric trench for an asymmetric trench structure (e.g., for an asymmetric trench isolation region) within a semiconductor substrate aligned below an opening in a semiconductor layer. With this technique, the opening is patterned in a mask layer so as to have a first sidewall with planar contour and a second sidewall with a saw-tooth contour. An etch process extends the opening through the semiconductor layer and into the semiconductor substrate. Then, another etch process (e.g., a crystallographic etch process) expands the lower portion of the opening within the semiconductor substrate, thereby forming a trench. Due to the different contours of the first and second sidewalls and, thereby the different crystal orientations of the semiconductor material exposed at the first and second sidewalls, the crystallographic etch process etches one sidewall faster than the other, resulting in an asymmetric trench. Also disclosed herein is a method of forming a semiconductor device and, particularly, a bipolar semiconductor device, such as a bipolar junction transistor (BJT) or heterojunction bipolar transistor (HBT). This method incorporates the above-mentioned asymmetric trench formation technique when forming a trench isolation region that undercuts an extrinsic base region and surrounds a collector pedestal. The asymmetry of the trench ensures that the trench isolation region has a relatively narrow width and, thereby ensures that both collector-to-base capacitance $C_{cb}$ and collector resistance $R_c$ within the resulting bipolar semiconductor device are minimized.

More particularly, disclosed herein is a method of forming an asymmetric trench for an asymmetric trench structure (e.g., an asymmetric trench isolation region) within a semiconductor substrate and aligned below an opening in a semiconductor layer. Specifically, the method can comprise providing a semiconductor substrate comprising a first semiconductor material and forming a semiconductor layer, comprising a second semiconductor material different from the first semiconductor material, on that semiconductor substrate.

A mask layer can be formed on the semiconductor layer and an opening can be patterned in the mask layer such that the opening has a first sidewall and a second sidewall opposite the first sidewall, where the first sidewall has a planar contour and the second sidewall has a saw-tooth contour. After the opening is patterned, a first etch process (e.g., an anisotropic etch process) can be performed to extend the opening through the semiconductor layer and into the semiconductor substrate. Thus, the opening will have a lower portion within the semiconductor substrate and an upper portion within the semiconductor layer.

Then, a second etch process can be performed in order to expand the lower portion of the opening within the semiconductor substrate without further expanding the upper portion of the opening within the semiconductor layer, thereby forming a trench within the semiconductor substrate below the semiconductor layer. Thus, this second etch process can be selective for the first semiconductor material over the second semiconductor material. Additionally, this second etch process can comprise a crystallographic etch process that etches the first and second sidewalls within the lower portion of the opening at different etch rates. That is, due to the different contours of the first and second sidewalls, the first semiconductor material exposed at the first and second sidewalls within the lower portion of the opening will have different crystal orientations and, thus, a crystallographic etch process can be used to etch back the first and second sidewalls at different rates. As a result, the trench will be asymmetric. Specifically, the trench will have opposing sides and the opposing sides will have different angles relative to the top surface of the semiconductor substrate and will undercut the semiconductor layer on either side of the opening by different distances.

After the asymmetric trench is formed, additional process steps can be performed in order to complete the asymmetric trench structure. For example, the asymmetric trench can be filled with at least one isolation material in order to form an asymmetric trench isolation region.

Also disclosed herein is a method of forming a semiconductor device and, particularly, a bipolar semiconductor device, such as a bipolar junction transistor (BJT) or heterojunction bipolar transistor (HBT). This method incorporates the above-mentioned asymmetric trench formation technique when forming a trench isolation region. Specifically, the method can comprise providing a semiconductor substrate comprising a first semiconductor material. A first semiconductor layer can be formed on the semiconductor substrate. This first semiconductor layer can comprise a second semiconductor material that is different from the first semiconductor material. Then, a second semiconductor layer can be formed on the first semiconductor layer. This second semiconductor layer can comprise the same first semiconductor material as the semiconductor substrate.

Subsequently, a mask layer can be formed on the second semiconductor layer and an opening can be patterned in the mask layer such that the opening has a first sidewall and a second sidewall opposite the first sidewall, where the first sidewall has a planar contour and the second sidewall has a saw-tooth contour. After the opening is patterned, a first etch process (e.g., an anisotropic etch process) can be performed to extend the opening through the second semiconductor layer and first semiconductor layer and into the semiconductor substrate. Thus, the opening will have a lower portion within the semiconductor substrate, a middle portion within the first semiconductor layer and an upper portion within the second semiconductor layer.

Then, a second etch process can be performed in order to expand the lower portion of the opening within the semiconductor substrate without expanding the middle portion of the opening within the first semiconductor layer, thereby forming a trench within the semiconductor substrate below the semiconductor layer. Thus, this second etch process can be selective for the first semiconductor material over the second semiconductor material. Additionally, this second etch process can comprise a crystallographic etch process that etches the first and second sidewalls within the lower portion of the opening at different etch rates. That is, due to the different contours of the first and second sidewalls, the first semiconductor material exposed at the first and second sidewalls within the lower portion of the opening will have different crystal orientations and, thus, a crystallographic etch process can be used to etch back the first and second sidewalls at different rates. As a result, the trench will be asymmetric. Specifically, the trench will have opposing sides and the opposing sides will have different angles relative to the top surface of the semiconductor substrate and will undercut the semiconductor layer on either side of the opening by different distances. It should be noted that this second etch process can simultaneously and laterally expand the upper portion of the opening within the second semiconductor layer.

After the asymmetric trench is formed, it can be filled with at least one isolation material in order to form an asymmetric trench isolation region. It should be understood that in addition to the process steps described above conventional bipolar semiconductor device processing steps can be performed in order to form three discrete terminal regions for the device within the semiconductor substrate, the first semiconductor layer and the second semiconductor layer. For example, before the first semiconductor layer is formed, a first terminal region (e.g., a collector region) for the bipolar semiconductor device can be formed in the semiconductor substrate and the asymmetric trench for the trench isolation region can subsequently be formed so as to be positioned laterally adjacent to that first terminal region and, particularly, so that the side of the asymmetric trench that undercuts the first semiconductor layer by the greatest distance is positioned laterally adjacent to that first terminal region. Furthermore, after the asymmetric trench is formed but before it is filled with isolation material(s), a second terminal region (e.g., a base region) for the bipolar semiconductor device can be formed in the first semiconductor layer such that the second terminal region is aligned above the first terminal region and a third terminal region (e.g., an emitter region) for the bipolar semiconductor device can be formed in the second semiconductor layer such that the third terminal region is aligned above the second terminal region. In such a bipolar semiconductor device, the trench isolation region with the relatively high aspect ratio ensures that collector-to-base capacitance $C_{cb}$ and collector resistance $R_c$ are both minimized.

Also disclosed herein is a bipolar semiconductor device, such as a bipolar junction transistor (BJT) or heterojunction bipolar transistor (HBT), formed according to the method described above. Specifically, this bipolar semiconductor device can comprise a semiconductor substrate and a first terminal region (e.g., a collector region) in the semiconductor substrate. The bipolar semiconductor device can further comprise a second terminal region (e.g., a base region) in a first semiconductor layer on the semiconductor substrate. This second terminal region can be aligned vertically above the first terminal region. The bipolar semiconductor device can further comprise a third terminal region (e.g., an emitter region) in a second semiconductor layer on the first semiconductor layer. This third terminal region can be aligned vertically above the second terminal region.

The bipolar semiconductor device can further comprise an opening, which extends vertically through the first semiconductor layer and which is further positioned laterally adjacent to the second terminal region, and an asymmetric trench, which is in the semiconductor substrate aligned below the opening and which is further positioned laterally adjacent to the first terminal region. Specifically, this asymmetric trench can have a first side adjacent to the first terminal region and a second side opposite the first side. The first side can have a first angle relative to the top surface of the semiconductor substrate and the second side can have a second angle, which is larger than the first angle, relative to the top surface of the semiconductor substrate. Additionally, the first side can be separated from the opening at a top surface of the semiconductor substrate by a first distance and the second side can be separated from the opening at the top surface of the semiconductor substrate by a second distance, which is less than the first distance. One or more isolation materials can fill the asymmetric trench, thereby forming an asymmetric trench isolation region. The isolation material(s) can also fill the opening in the first semiconductor layer above the asymmetric trench. In such a bipolar semiconductor device, the asymmetric trench isolation region with the relatively ensures that both collector-to-base capacitance $C_{cb}$ and collector resistance $R_c$ are minimized.

BRIEF DESCRIPTION OF THE DRAWINGS

The structures and method disclosed herein will be better understood from the following detailed description with reference to the drawings, which are not necessarily drawn to scale and in which.

DETAILED DESCRIPTION

Figure 1:
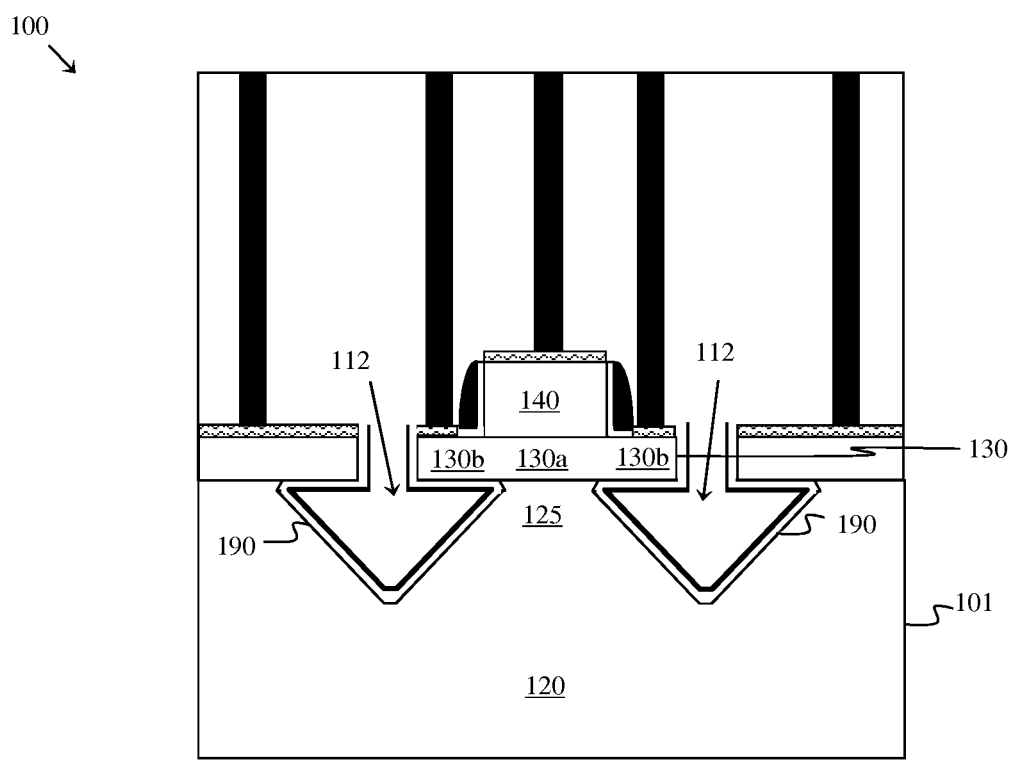
FIG. 1 is a cross-section diagram illustrating a bipolar semiconductor device.

As mentioned above, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic capacitances and resistances including, but are not limited to, parasitic collector-to-base capacitance $C_{cb}$ and parasitic collector resistance $R_c$. Reduction of the parasitic capacitances and resistances can result in a higher $f_{max}$. Recently, bipolar semiconductor devices have been developed with trench isolation regions that help to reduce collector-to-base capacitance $C_{cb}$. For example, as illustrated in FIG. 1, a bipolar semiconductor device 100 can comprise a semiconductor substrate 101 and a collector region 120 within the semiconductor substrate 101. The bipolar semiconductor device 100 can further comprise a base layer 130 on the top surface of the semiconductor substrate 101 and an emitter layer 140 on the base layer 130. Specifically, the base layer 130 can comprise an intrinsic base portion 130a and an extrinsic base portion 130b positioned laterally adjacent. The emitter layer 140 can be aligned above the intrinsic base portion 130a. Additionally, a trench isolation region 190 can be within the semiconductor substrate 101 adjacent to a collector region 120. This trench isolation region 190 can comprise an isolation material filled trench 112 that undercuts the extrinsic base portion 130b of the base layer 130. By undercutting the extrinsic base portion 130b of the base layer 130, the trench isolation region 190 effectively creates a relatively narrow collector pedestal 125 extending vertically from the intrinsic base portion 130a to the collector region 120 and, thereby reducing collector-to-base capacitance $C_{cb}$. However, current techniques for forming the trench 112 for a trench isolation region 190 create a trench 112 having a relatively low aspect ratio (i.e., the width of the trench 112 is approximately equal to or less than the depth) and, particularly, create a trench 112 that is both relatively wide and relatively deep. As a result, the distance current must flow through the collector region 120 increases and, thereby increasing collector resistance $R_c$.

In view of the foregoing, disclosed herein is an improved technique for forming an asymmetric trench for an asymmetric trench structure (e.g., for an asymmetric trench isolation region) within a semiconductor substrate aligned below an opening in a semiconductor layer. With this technique, the opening is patterned in a mask layer so as to have a first sidewall with planar contour and a second sidewall with a saw-tooth contour. An etch process extends the opening through the semiconductor layer and into the semiconductor substrate. Then, another etch process (e.g., a crystallographic etch process) expands the lower portion of the opening within the semiconductor substrate, thereby forming a trench. Due to the different contours of the first and second sidewalls and, thereby the different crystal orientations of the semiconductor material exposed at the first and second sidewalls, the crystallographic etch process etches one sidewall faster than the other, resulting in an asymmetric trench. Also disclosed herein is a method of forming a semiconductor device and, particularly, a bipolar semiconductor device, such as a bipolar junction transistor (BJT) or heterojunction bipolar transistor (HBT). This method incorporates the above-mentioned asymmetric trench formation technique when forming a trench isolation region that undercuts an extrinsic base region and surrounds a collector pedestal. The asymmetry of the trench ensures that the trench isolation region has a relatively narrow width and, thereby ensures that both collector-to-base capacitance $C_{cb}$ and collector resistance $R_c$ within the resulting bipolar semiconductor device are minimized.

Figure 2:
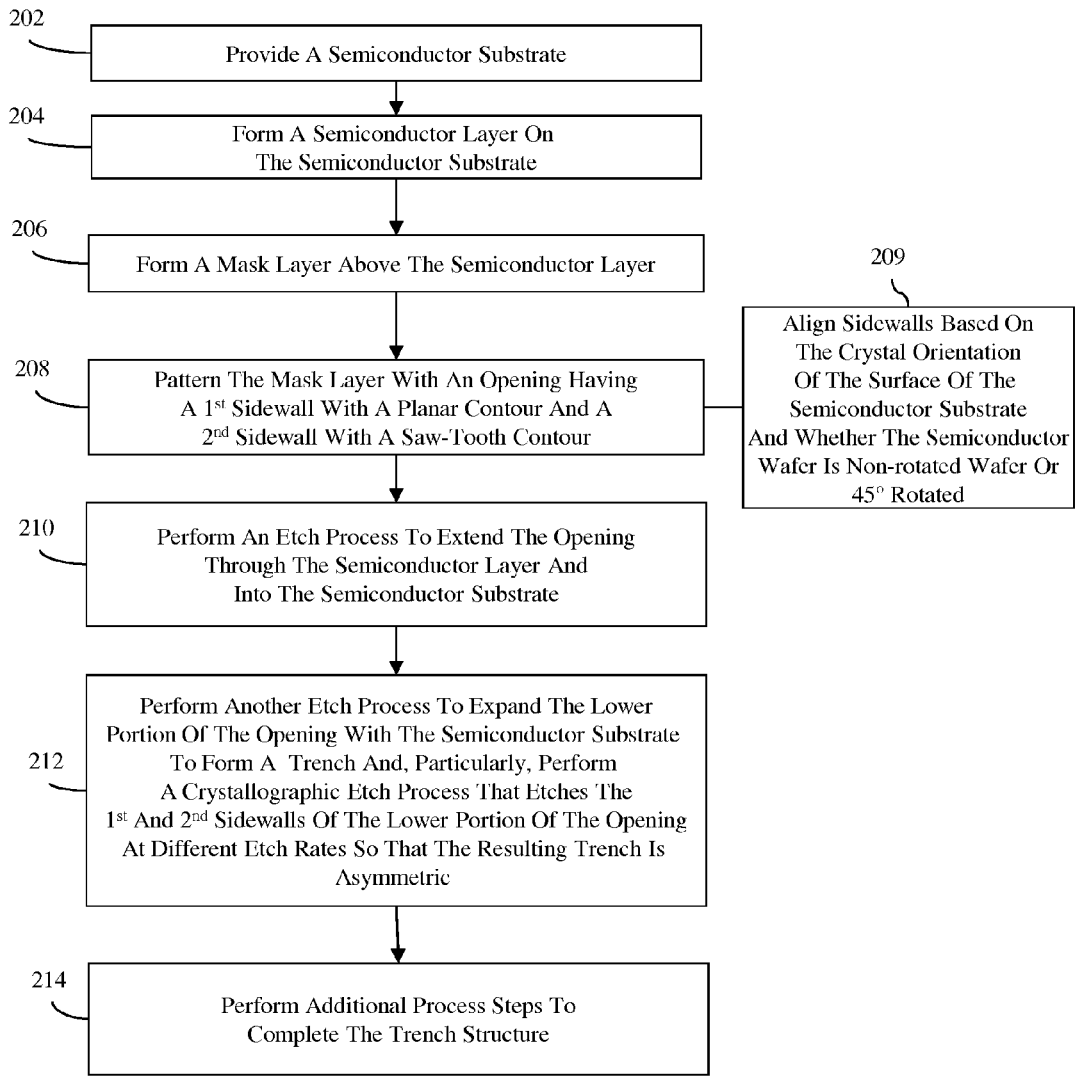
FIG. 2 is a flow diagram illustrating a method of forming an asymmetric trench for an asymmetric trench structure within a semiconductor substrate and below a semiconductor layer.
Figure 3:
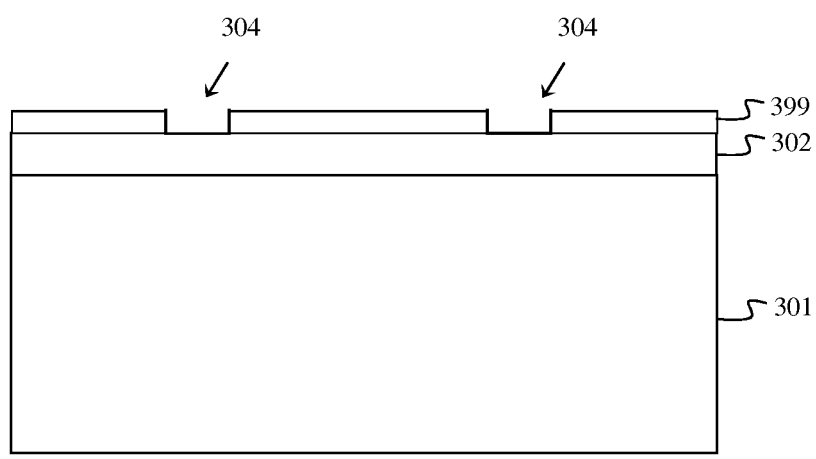
FIG. 3 is a cross-section diagram illustrating a partially completed asymmetric trench structure formed according to the flow diagram of FIG. 2.

More particularly, FIG. 2 is a flow diagram illustrating a method of forming an asymmetric trench for an asymmetric trench structure (e.g., for an asymmetric trench isolation region or for any other asymmetric trench structure, such as an asymmetric trench capacitor) within a semiconductor substrate and below a semiconductor layer. Specifically, the method can comprise providing a semiconductor substrate 301 having a top surface 311 (202, see FIG. 3). This semiconductor substrate 301 can comprise a bulk semiconductor substrate, as illustrated in FIG. 3. Alternatively, the semiconductor substrate 301 can comprise a semiconductor-on-insulator (SOI) wafer (not shown). In any case, the semiconductor substrate 301 (or in the case of an SOI wafer, the top layer) can comprise a first semiconductor material and, particularly, a monocrystalline semiconductor material, such as monocrystalline silicon or any other suitable monocrystalline semiconductor material.

The method can further comprise forming a semiconductor layer 302 on that top surface 311 of the semiconductor substrate 301 (204, see FIG. 3). This semiconductor layer 302 can be formed, for example, by using an epitaxial semiconductor deposition process or any other suitable semiconductor deposition process. In any case, this semiconductor layer 302 can comprise a second semiconductor material that is different from the first semiconductor material. The difference between the first semiconductor material and second semiconductor material can be, for example, a difference in chemical composition and/or a difference in crystalline structure such that the first semiconductor material can be selectively etched over the second semiconductor material. For example, if the first semiconductor material comprises monocrystalline silicon, the second semiconductor material can comprise silicon germanium, silicon carbide, silicon germanium carbide, polycrystalline silicon, etc.

The method can further comprise forming a mask layer 399 above the semiconductor layer 302 (206, see FIG. 3). The mask layer 399 comprises, for example, a silicon nitride layer and can be formed, for example, by chemical vapor deposition (CVD) or plasma-enhanced chemical vapor deposition (PECVD).

Figure 4A:
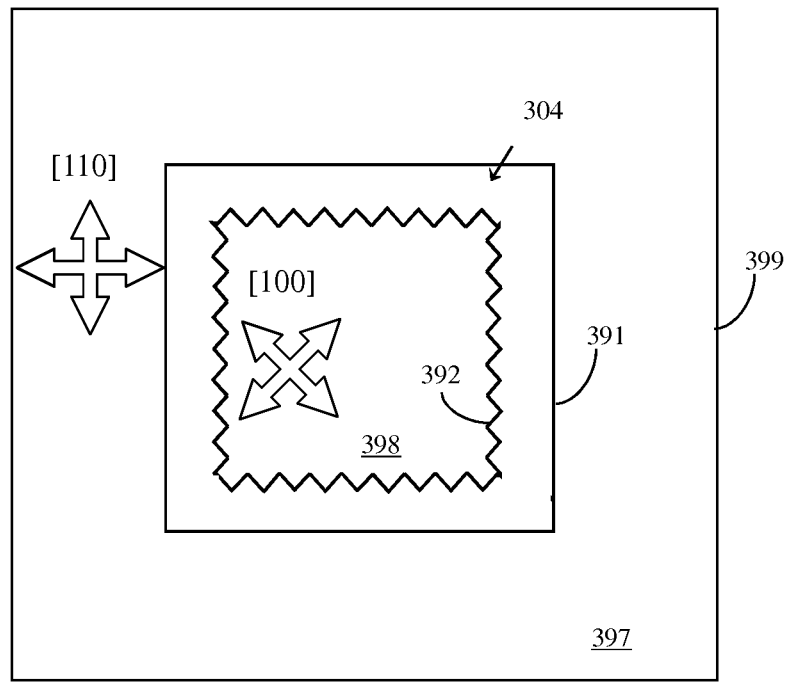
FIG. 4A is a top view diagram further illustrating the partially completed asymmetric trench structure of FIG. 3.
Figure 4B:
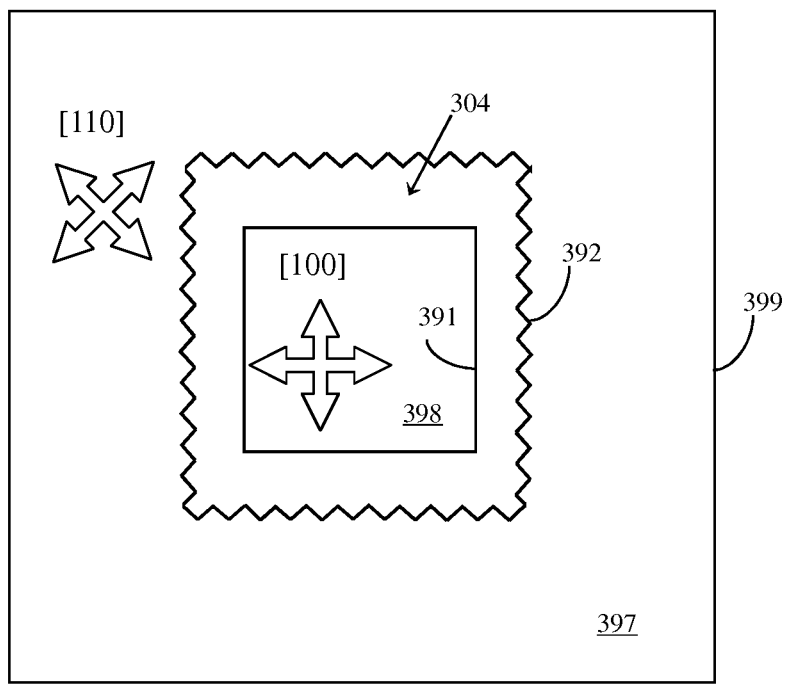
FIG. 4B is an alternative top view diagram further illustrating the partially completed asymmetric trench structure of FIG. 3.

Next, the method can comprise patterning this mask layer 399 with an opening 304 (208, see FIG. 3 and also FIGS. 4A-4B). Specifically, the opening 304 can be patterned into the mask layer 399 (e.g., using conventional lithographic patterning and etch techniques) such that the opening 304 has a first sidewall 391 and a second sidewall 392 opposite the first sidewall 391, where the first sidewall 391 has a planar contour (i.e., has a flat surface) and the second sidewall 392 has a saw-tooth contour (i.e., has a corrugated surface with triangular peaks). Alignment of the first sidewall 391 with the planar contour and the second sidewall 392 with the saw-tooth contour can be based on the surface orientation of the semiconductor substrate 301 and on whether the semiconductor wafer is non-rotated or rotated (e.g., 45° rotated) (209).

For example, if the semiconductor substrate 301 has a [100] surface orientation and the semiconductor wafer that contains the semiconductor substrate 301 is non-rotated (i.e., the notch is located at the end of a [110] crystal plane), the first sidewall 391 with the planar contour can be aligned so that it is parallel to <110> crystal directions and the second sidewall 392 with the saw-tooth contour can be aligned so that it has edges, which form peaks, that are parallel to <100> crystal directions, as shown in FIG. 4A. Alternatively, if the semiconductor substrate 301 has a [100] surface orientation and the semiconductor wafer that contains the semiconductor substrate 301 is 45° rotated (i.e., the notch is located at the end of a [100] crystal plane), the first sidewall 391 with the planar contour can be aligned so that it is parallel to <100> crystal directions and the second sidewall 392 with the saw-tooth contour can be aligned so that it has edges, which form peaks, that are parallel to <110> crystal directions, as shown in FIG. 4B.

It should noted that, for illustration purposes, the opening 304 is showed in both FIG. 4A and FIG. 4B as a continuous opening (i.e., an opening without ends) with four sections that define and, particularly, laterally surround an inner section 398 of the mask layer 399 so as to physically separate it from an outer section 397. Thus, as shown in FIG. 4A, in each of the four sections the first sidewall 391 can be aligned so as to be parallel to the <110> crystal directions; whereas, as shown in FIG. 4B, in each of the four sections the first sidewall 391 can be aligned so as to be parallel to the <100> crystal directions. Alternatively, the opening 304 could be an essentially rectangular shaped opening with four discrete sidewalls, including a first sidewall, a second sidewall opposite the first sidewall, a third sidewall and a fourth sidewall opposite the second sidewall (not shown). In this case, the first and second sidewalls can have the planar and saw-tooth contours, respectively, aligned in the same manner as discussed above with regard to FIGS. 4A and 4B and the contours of the third and fourth sidewalls can vary depending upon the desired configuration for the resulting trench structure.

Figure 5:
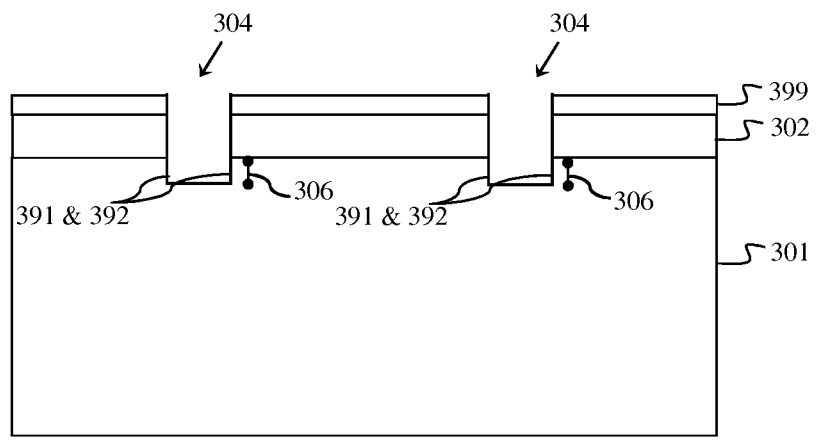
FIG. 5 is a cross-section diagram illustrating a partially completed asymmetric trench structure formed according to the flow diagram of FIG. 2.

Next, the method can comprise performing a first etch process (e.g., an anisotropic etch process) to extend the opening 304 vertically through the semiconductor layer 302 into the semiconductor substrate 301 (210, see FIG. 5). This first etch process 210 can be performed such that the opening 304 extends a predetermined depth 306 into the semiconductor substrate 301 (e.g., as measured from the top surface 311 of the semiconductor substrate 301) and, thus, such that the first and second sidewall 391-392 extend into the semiconductor substrate 301. In this case, the opening 304 will have a lower portion within the semiconductor substrate 301 and an upper portion within the semiconductor layer 302.

Figure 6:
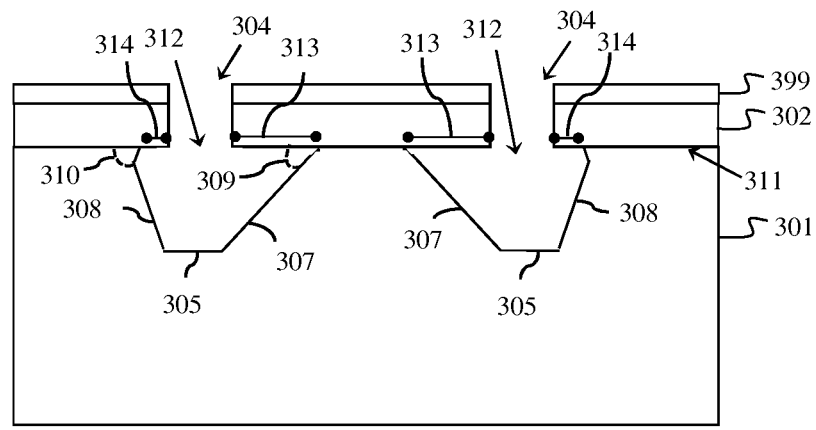
FIG. 6 is a cross-section diagram illustrating a partially completed asymmetric trench structure formed according to the flow diagram of FIG. 2.

Then, a second etch process can be performed to expand the lower portion of the opening 304 within the semiconductor substrate 301 without further expanding the upper portion of the opening 304 within the semiconductor layer 302, thereby forming a trench 312 within the semiconductor substrate 301 below the semiconductor layer 302 (212, see FIG. 6). Thus, the second etch process can be selective for the first semiconductor material of the semiconductor substrate 301 over the second semiconductor material of the semiconductor layer 302. Additionally, this second etch process 212 can specifically comprise a crystallographic etch process (e.g., a crystallographic wet etch process) that etches the first and second sidewalls 391-392 within the lower portion of the opening 304 at different rates. That is, due to the different contours of the first and second sidewalls 391-392, the first semiconductor material exposed at the first and second sidewalls 391-392 within the lower portion of the opening 304 will have different crystal orientations and, thus, a crystallographic etch process can be used to etch back the first and second sidewalls 391-392 at different rates. As a result, the trench 312 will be asymmetric.

Specifically, the asymmetric trench 312 will have a bottom surface 305 some distance from the top surface 311 of the semiconductor substrate and opposing sides 307-308. The opposing sides 307-308 will have different angles 309-310, respectively, relative to the top surface 311 and will undercut the semiconductor layer 302 on either side of the opening 304 by different distances 313-314, respectively. That is, the asymmetric trench 312 will have a first side 307 and a second side 308 opposite the first side 307. The first side 307 will have a first angle 309 relative to the top surface 311 of the semiconductor substrate 301. The second side 308 will have a second angle 310 relative to the top surface 311 of the semiconductor substrate 301 and this second angle 310 will be larger than the first angle 309. Additionally, the first side 307 will undercut the semiconductor layer 302 on one side of the opening 304 by a first distance 313 and the second side 308 will undercut the semiconductor layer 302 on the opposite side of the opening 304 by a second distance 314 that is less than the first distance 313.

Specifications for the crystallographic etch process can vary depending upon the different crystalline orientations of the first semiconductor material exposed at the first and second sidewalls 391-392. For example, in a case where the first semiconductor material comprises monocrystalline silicon and the second semiconductor material comprises silicon germanium, the crystallographic wet etch process can be performed, for example, using hydroxide (OH)-based chemicals (e.g., potassium hydroxide (KOH), tetramethylammonium hydroxide (TMAH), ammonia hydroxide ($NH_4OH$) or any other suitable hydroxide (OH)-based chemicals) that have etch selectivity for silicon over silicon germanium and that further have etch selectivity for {110} crystal planes in monocrystalline silicon over {111} crystal planes (i.e., that is capable of etching {110}crystal planes of monocrystalline silicon at a first etch rate and {111} crystal planes of monocrystalline silicon at a second etch rate that is slower than the first etch rate). Those skilled in the art will recognize that the different etch rates may vary as a function of the concentration of etchant material used.

It should be noted that the different crystal orientations of the first semiconductor material at the first and second sidewalls 391-392 will depend upon the contour, the surface orientation of the substrate and whether or not the semiconductor wafer that contains semiconductor substrate 301 is non-rotated or rotated (e.g., 45° rotated).

So, for example, if, as described above and illustrated in FIG. 4A, the semiconductor substrate 301 has a [100] surface orientation, the semiconductor wafer that contains the semiconductor substrate 301 is non-rotated, the first sidewall 391 with the planar contour is aligned so that it is parallel to <110> crystal directions and the second sidewall 392 with the saw-tooth contour is aligned so that it has edges, which form peaks, that are parallel to <100> crystal directions, then a crystallographic wet etch process using a hydroxide (OH)-based chemical could be performed. In this case, the first semiconductor material at the second sidewall 392 will etch at the faster etch rate (i.e., the first rate) as compared the first semiconductor material at the first sidewall 391 such that, after the crystallographic wet etch process, the portion of the first sidewall within the semiconductor substrate will be a{111}-oriented sidewall and the portion of the second sidewall within the semiconductor substrate will be a {110}-oriented sidewall. Thus, as illustrated in FIG. 6, the first side 307 of the asymmetric trench 312 will have a {110}-orientation and the second side 308 of the asymmetric trench 312 will have a {111}-orientation.

Similarly, if, as described above and illustrated in FIG. 4B, the semiconductor substrate 301 has a [100] surface orientation, the semiconductor wafer that contains the semiconductor substrate 301 is 45° rotated, the first sidewall 391 with the planar contour is aligned so that it is parallel to <100> crystal directions and the second sidewall 392 with the saw-tooth contour is aligned so that it has edges, which form peaks, parallel to <110> crystal directions, then the same crystallographic wet etch process using a hydroxide (OH)-based chemical could be performed. In this case, however, the first semiconductor material at the first sidewall 391 will etch at the faster etch rate (i.e., the first rate) as compared the first semiconductor material at the second sidewall 392 such that, after the crystallographic wet etch process, the portion of the first sidewall within the semiconductor substrate will be a {110}-oriented sidewall and the portion of the second sidewall within the semiconductor substrate will be a {111}-oriented sidewall. This will result in the same asymmetric trench 312 as illustrated in FIG. 6, with the first side 307 of the asymmetric trench 312 having a {110}-orientation and the second side 308 of the asymmetric trench 312 having a {111}-orientation.

Those skilled in the art will recognize that, in any case, the {110}-oriented first side 307 of the asymmetric trench 312 will have a first angle 309 of approximately 45° with respect to the [100] surface orientation of the semiconductor substrate 301 and the {111}-oriented second side 308 will have a second angle 310 that is approximately 54.7° with respect to the [100] surface orientation of the semiconductor substrate 301.

After the asymmetric trench 312 is formed, additional processing steps can be performed in order to complete an asymmetric trench structure (e.g., to complete an asymmetric trench isolation region, to complete an asymmetric trench capacitor, etc.) using the asymmetric trench 312 (214). For example, in the case of an asymmetric trench isolation region, one or more isolation materials can be deposited so as to line (optionally) and fill the asymmetric trench 312. Techniques for forming such trench structures following trench formation are well known in the art and, thus, the details are omitted from this specification in order to allow the reader to focus on the salient aspects of the disclosed method.

Figure 7:
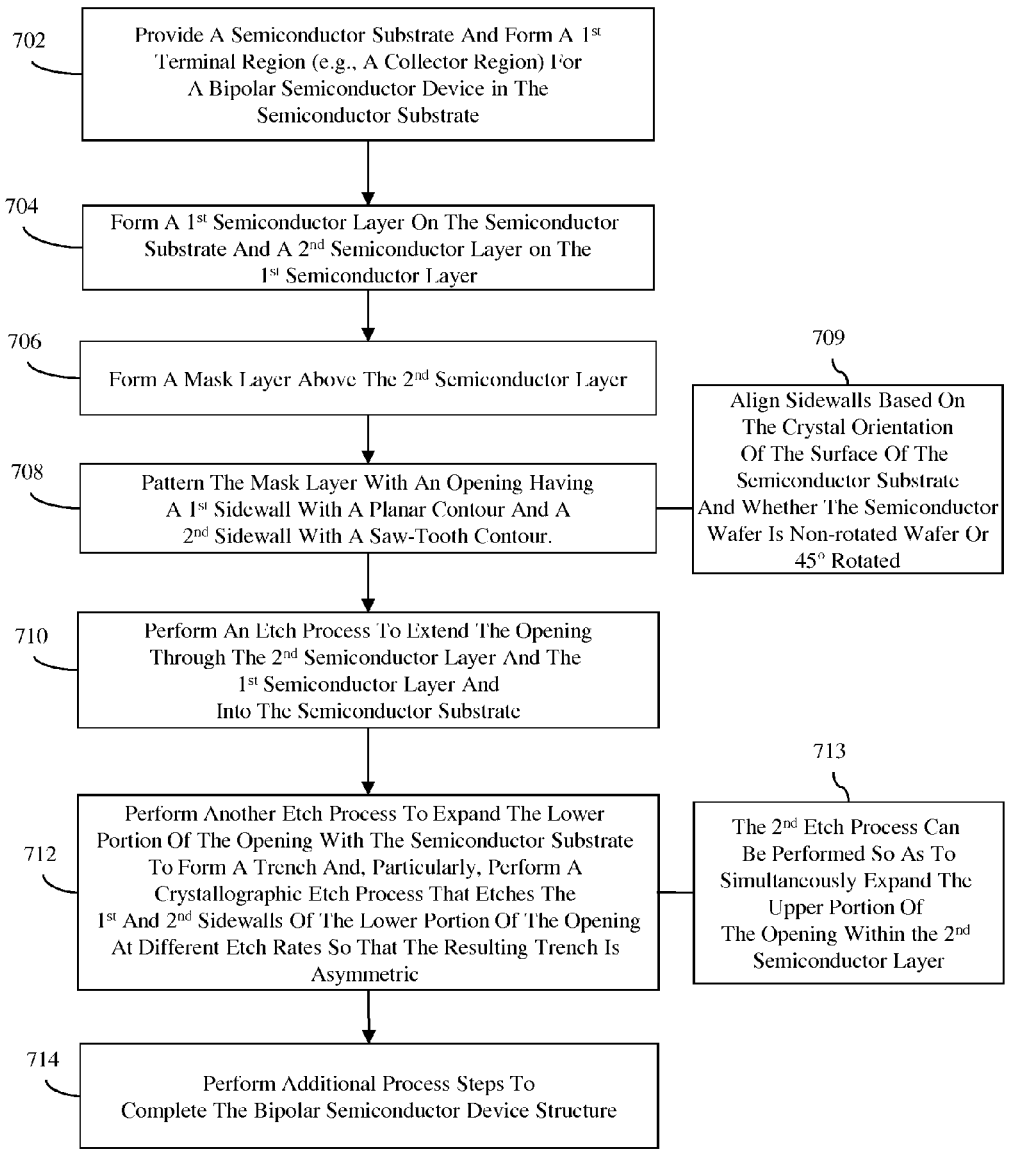
FIG. 7 is a flow diagram illustrating a method of forming a bipolar semiconductor device incorporating an asymmetric trench isolation region.

Referring to the flow diagram of FIG. 7, also disclosed herein is a method of forming a semiconductor device and, particularly, a bipolar semiconductor device, such as a bipolar junction transistor (BJT) or heterojunction bipolar transistor (HBT). This method incorporates the above-mentioned asymmetric trench formation technique when forming a trench isolation region.

Figure 8:
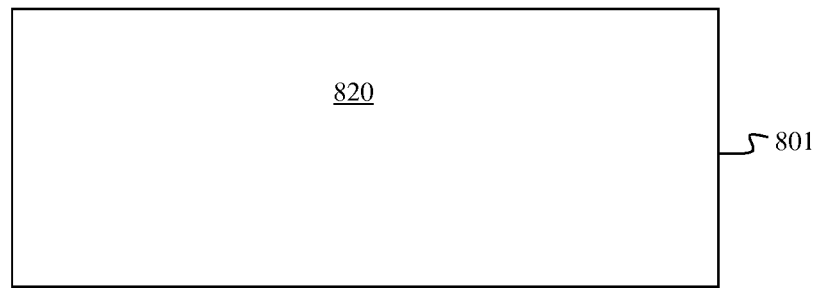
FIG. 8 is a cross-section diagram illustrating a partially completed bipolar semiconductor device formed according to the flow diagram of FIG. 7.

Specifically, the method can comprise providing a semiconductor substrate 801 with a top surface 811 and forming a first terminal region 820 (e.g., a collector region) in that semiconductor substrate 801 (702, see FIG. 8). This semiconductor substrate 801 can comprise a bulk semiconductor substrate, as illustrated in FIG. 8. Alternatively, the semiconductor substrate 801 can comprise a semiconductor-on-insulator (SOI) wafer (not shown). In any case, the semiconductor substrate 801 (or in the case of an SOI wafer, the top semiconductor layer of the SOI wafer) can comprise a first semiconductor material and, particularly, a monocrystalline semiconductor material (e.g., monocrystalline silicon or any other suitable monocrystalline semiconductor material) having a first type conductivity (e.g., a P-type conductivity). Thus, for example, the semiconductor substrate 801 can comprise a P-silicon substrate (i.e., a silicon substrate having a relatively low concentration of a P-type dopant). Additionally, a first terminal region 820 (e.g., a collector region) can be formed within this semiconductor substrate 801. The first terminal region 820 can be formed, for example, using a dopant implantation process such that the first terminal region 820 comprises a well region having a second type conductivity that is different from the first type conductivity (e.g., such that it comprises an N-well region having an N-type conductivity).

Figure 9:
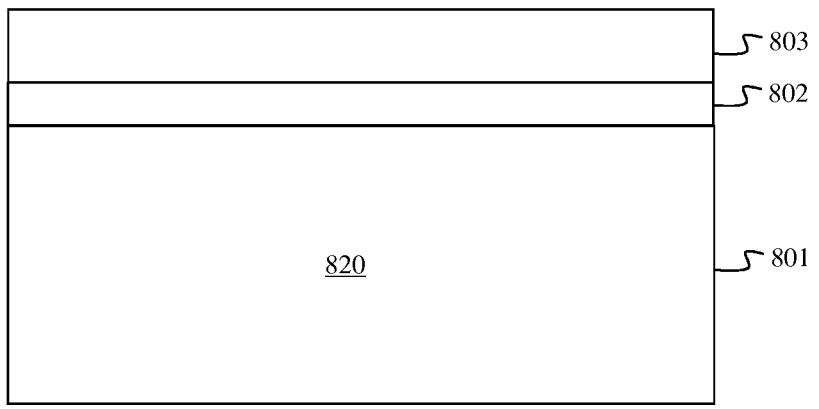
FIG. 9 is a cross-section diagram illustrating a partially completed bipolar semiconductor device formed according to the flow diagram of FIG. 7.

A first semiconductor layer 802 can be formed on the top surface 811 of the semiconductor substrate 801 and a second semiconductor layer 803 can be formed on the first semiconductor layer 802 (704, see FIG. 9). Specifically, the first semiconductor layer 802 can be formed, for example, by using an epitaxial semiconductor deposition process or any other suitable semiconductor deposition process. In any case, this first semiconductor layer 802 can comprise a second semiconductor material that is different from the first semiconductor material. The difference between the first semiconductor material and second semiconductor material can be, for example, a difference in chemical composition such that the first semiconductor material can be selectively etched over the second semiconductor material. For example, if the first semiconductor material of the semiconductor substrate 801 comprises monocrystalline silicon, the second semiconductor material of the first semiconductor layer 802 can comprise silicon germanium, silicon carbide, or silicon germanium carbide. This first semiconductor layer 802 can be deposited such that remains undoped (i.e., such that it is not doped with either a N-type or P-type dopant). Alternatively, this first semiconductor layer 802 can be in-situ doped or subsequently implanted with a relatively low concentration of a first type conductivity dopant (e.g., a P-type dopant) and, thereby such that it has the same type conductivity as the semiconductor substrate 801 (e.g., P-type conductivity). Alternatively, this first semiconductor layer 802 can be in-situ doped or subsequently implanted so that it has a relatively thin un-doped lower portion that it has neither N-type, nor P-type conductivity and an upper portion that is doped with a relatively low concentration of a first type conductivity dopant (e.g., a P-type dopant).

The second semiconductor layer 803 can similarly be formed by using an epitaxial semiconductor deposition process or any other suitable semiconductor deposition process. In any case, this second semiconductor layer 803 can comprise, for example, the same first semiconductor material as the semiconductor substrate 801. This second semiconductor layer 803 can be in-situ doped or subsequently implanted with a second type conductivity dopant (e.g., an N-type dopant) and, thereby such that it has the same type conductivity as the first terminal region 820 within the semiconductor substrate 801 (e.g., N-type conductivity).

Figure 10:
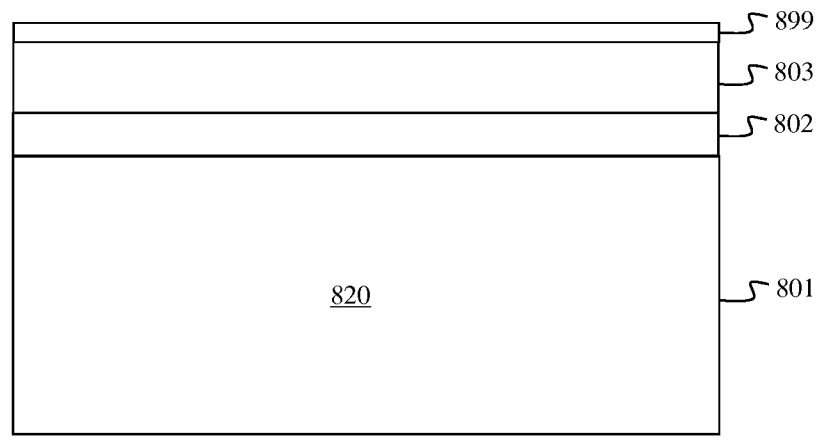
FIG. 10 is a cross-section diagram illustrating a partially completed bipolar semiconductor device formed according to the flow diagram of FIG. 7.

The method can further comprise forming a mask layer 899 above the first semiconductor layer 802 (706, see FIG. 10). The mask layer 899 comprises, for example, a silicon nitride layer and can be formed, for example, by chemical vapor deposition (CVD) or plasma-enhanced chemical vapor deposition (PECVD).

Figure 11:
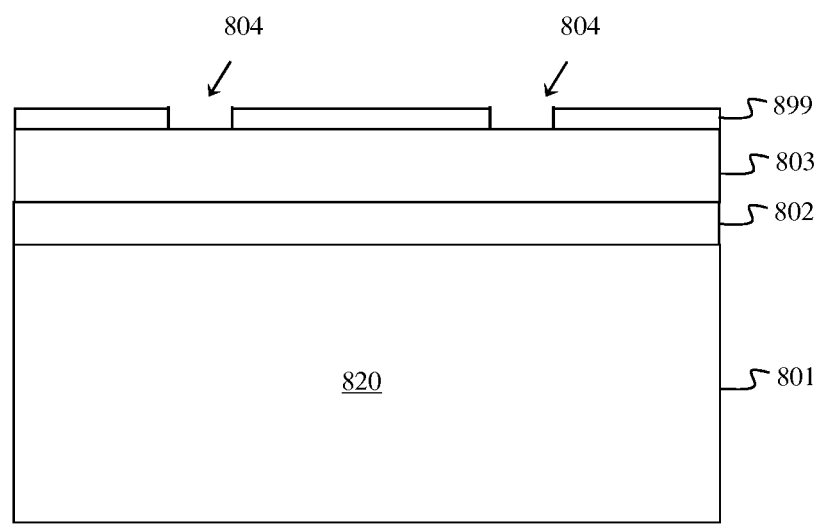
FIG. 11 is a cross-section diagram illustrating a partially completed bipolar semiconductor device formed according to the flow diagram of FIG. 7.
Figure 12A:
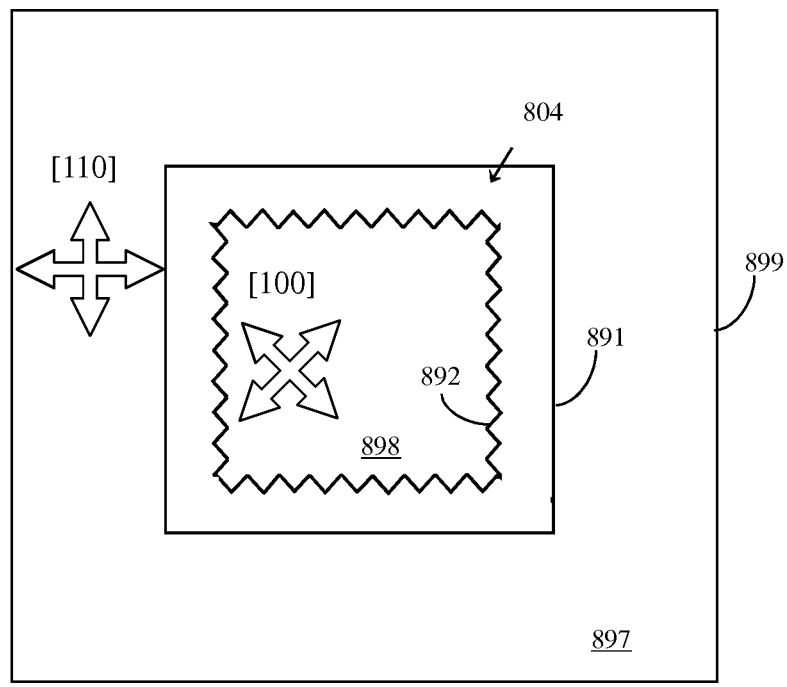
FIG. 12A is a top view diagram further illustrating the partially completed bipolar semiconductor device of FIG. 11.
Figure 12B:
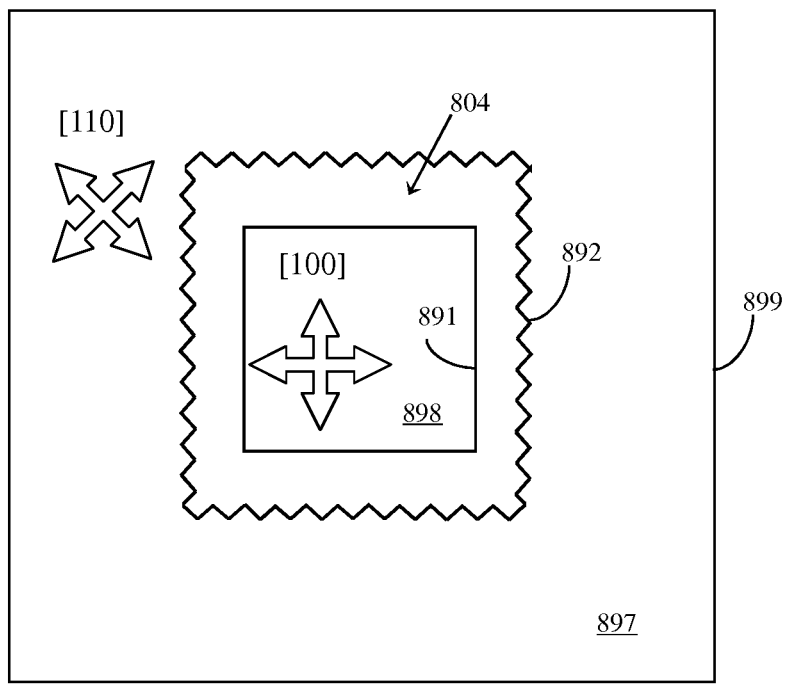
FIG. 12B is an alternative top view diagram further illustrating the partially completed bipolar semiconductor device of FIG. 11.

Next, the method can comprise patterning this mask layer 899 with an opening 804 (708, see FIG. 11 and also FIGS. 12A-12B). Specifically, the opening 804 can be patterned into the mask layer 899 (e.g., using conventional lithographic patterning and etch techniques) such that the opening 804 has a first sidewall 891 and a second sidewall 392 opposite the first sidewall 891, where the first sidewall 891 has a planar contour (i.e., has a flat surface) and the second sidewall 892 has a saw-tooth contour (i.e., has a corrugated surface with triangular peaks). Alignment of the first sidewall 891 with the planar contour and the second sidewall 892 with the saw-tooth contour can be based on the surface orientation of the semiconductor substrate 801 and on whether the semiconductor wafer is non-rotated or rotated (e.g., 45° rotated) (709).

For example, if the semiconductor substrate 801 has a [100] surface orientation and the semiconductor wafer that contains the semiconductor substrate 801 is non-rotated (i.e., the notch is located at the end of a [110] crystal plane), the first sidewall 891 with the planar contour can be aligned so that it is parallel to <110> crystal directions and the second sidewall 892 with the saw-tooth contour can be aligned so that it has edges, which form peaks, that are parallel to <100> crystal directions, as shown in FIG. 12A. Alternatively, if the semiconductor substrate 801 has a [100] surface orientation and the semiconductor wafer that contains the semiconductor substrate 801 is 45° rotated (i.e., the notch is located at the end of a [100] crystal plane), the first sidewall 891 with the planar contour can be aligned so that it is parallel with <100> crystal directions and the second sidewall 892 with the saw-tooth contour can be aligned so that it has edges, which form peaks, that are parallel to <110> crystal directions, as shown in FIG. 12B.

It should noted that, for illustration purposes, the opening 804 is showed in both FIG. 12A and FIG. 12B as a continuous opening (i.e., an opening without ends) with four sections that define and, particularly, laterally surround an inner section 898 of the mask layer 899 (e.g., aligned above the first terminal region 820) so as to physically separate that inner section 898 from an outer section 897. Thus, as shown in FIG. 12A, in each of the four sections the first sidewall 891 can be aligned so that it is parallel to the <110> crystal directions; whereas, as shown in FIG. 12B, in each of the four sections the first sidewall 891 can be aligned so that it is parallel to the <100> crystal directions.

Figure 13:
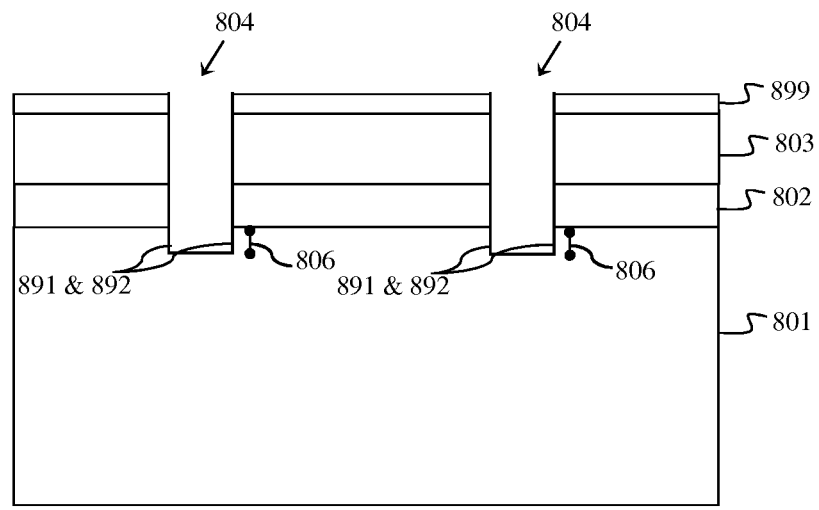
FIG. 13 is a cross-section diagram a partially completed bipolar semiconductor device formed according to the flow diagram of FIG. 7.

Next, the method can comprise performing a first etch process (e.g., an anisotropic etch process) to extend the opening 804 vertically through the first semiconductor layer 802 and second semiconductor layer 803 into the semiconductor substrate 801 (710, see FIG. 13). This first etch process 810 can be performed such that the opening 804 extends a predetermined depth 806 into the semiconductor substrate 801 (e.g., as measured from the top surface 811 of the semiconductor substrate 801) and, thus, such that the first and second sidewalls 891-892 extend into the semiconductor substrate 801. In this case, the opening 804 will have a lower portion within the semiconductor substrate 801, a middle portion within the first semiconductor layer 802 and an upper portion within the second semiconductor layer 803. It should be noted that this opening 804 can be patterned at process 708 above (as illustrated in FIG. 12A or 12B) so that when it extends through the semiconductor layers 802-803 is laterally surrounds and defines the boundaries of the active region of the bipolar semiconductor device being formed and, particularly, the boundaries of a second terminal region 830 and, particularly, a base region within the first semiconductor layer 802 (e.g., such that the base region has a width of, for example, approximately 1.2 µm).

Figure 14:
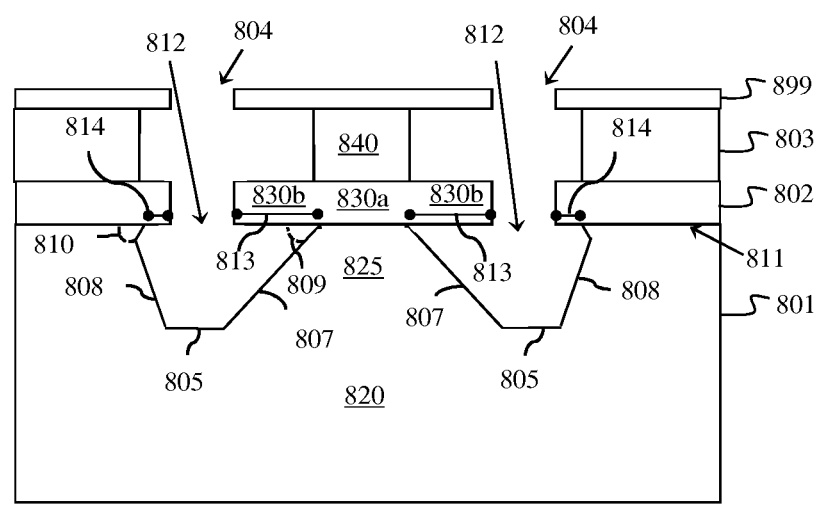
FIG. 14 is a cross-section diagram illustrating a partially completed bipolar semiconductor device formed according to the flow diagram of FIG. 7.

Then, a second etch process can be performed to expand the lower portion of the opening 804 within the semiconductor substrate 801 without further expanding the middle portion of the opening 804 within the first semiconductor layer 802, thereby forming a trench 812 within the semiconductor substrate 801 below the semiconductor layer 802 (712, see FIG. 14). This trench 812 can define and, particularly, can laterally surround a relatively narrow portion of the first terminal region 820 (i.e., a first terminal pedestal region 825, for example, a collector pedestal region) at the top surface of the semiconductor substrate 801 aligned below the second terminal region 830 (e.g., the base region).

The second etch process can be selective for the first semiconductor material of the semiconductor substrate 801 over the second semiconductor material of the first semiconductor layer 802. Additionally, this second etch process 712 can specifically comprise a crystallographic etch process (e.g., a crystallographic wet etch process) that etches the first and second sidewalls 891-892 within the lower portion of the opening 804 at different rates. That is, due to the different contours of the first and second sidewalls 891-892, the first semiconductor material exposed at the first and second sidewalls 891-892 within the lower portion of the opening 804 will have different crystal orientations and, thus, a crystallographic etch process can be used to etch back the first and second sidewalls 891-392 at different rates. As a result, the trench 812 will be asymmetric.

Specifically, the asymmetric trench 812 will have a bottom surface 805 some distance from the top surface 811 of the semiconductor substrate 801 and opposing sides 807-808. The opposing sides 807-808 will have different angles 809-810, respectively, relative to the top surface 811 of the semiconductor substrate 801 and will undercut the first semiconductor layer 802 on either side of the opening 804 by different distances 813-814, respectively. That is, the asymmetric trench 812 will have a bottom surface 805, a first side 807 positioned laterally adjacent to the first terminal pedestal region 825 (e.g., adjacent to the collector pedestal region) and a second side 808 opposite the first side 807. The first side 807 will have a first angle 809 relative to the top surface 811 of the semiconductor substrate 801. The second side 808 will have a second angle 810 relative to the top surface 811 of the semiconductor substrate 801 and this second angle 810 will be larger than the first angle 809. Additionally, the first side 807 will undercut the first semiconductor layer 802 and, particularly, edge portions of the second terminal region 830 on one side of the opening 804 by a first distance 813 (e.g., of approximately 0.4 µm) and the second side 808 will undercut the first semiconductor layer 802 on the opposite side of the opening 804 by a second distance 814 that is less than the first distance 813 (e.g., by 0.2 µm or less).

It should be noted that this second etch process can simultaneously laterally expand the upper portion of the opening 804 within the second semiconductor layer 803 (713). That is, the second etch process can etch back the second semiconductor layer 803 by similar distances on either side of the opening 804 (e.g., approximately 0.4 µm and 0.2 µm or less, respectively) at process 710. Etching back the second semiconductor layer 803 in this manner defines the boundaries and, particularly, the width (e.g., of approximately 0.4 µm) of a third terminal region 840 (e.g., an emitter region) and further defines an intrinsic base portion 830a of the base region 830, which is aligned vertically between the first terminal pedestal region 825 and the third terminal region 840, and an extrinsic base portion 830b of the base region 830, which extends laterally beyond the third terminal region 840 and which is undercut by the first side 807 of the asymmetric trench 812.

Specifications for the crystallographic etch process can vary depending upon the different crystalline orientations of the first semiconductor material exposed at the first and second sidewalls 891-892. For example, in a case where the first semiconductor material comprises monocrystalline silicon and the second semiconductor material comprises silicon germanium, the crystallographic wet etch process can be performed, for example, using hydroxide (OH)-based chemicals (e.g., potassium hydroxide (KOH), tetramethylammonium hydroxide (TMAH), ammonia hydroxide (NH$_4$OH) or any other suitable hydroxide (OH)-based chemicals) that have etch selectivity for silicon over silicon germanium and that further have etch selectivity for {110} crystal planes in monocrystalline silicon over {111} crystal planes (i.e., that is capable of etching {110} crystal planes of monocrystalline silicon at a first etch rate and {111} crystal planes of monocrystalline silicon at a second etch rate that is slower than the first etch rate). Those skilled in the art will recognize that the different etch rates may vary as a function of the concentration of etchant material used.

It should be noted that the different crystal orientations of the first semiconductor material at the first and second sidewalls 891-892 will depend upon the contour, the surface orientation of the substrate and whether or not the semiconductor wafer that contains semiconductor substrate 801 is non-rotated or rotated (e.g., 45° rotated).

So, for example, if, as described above and illustrated in FIG. 12A, the semiconductor substrate 801 has a [100] surface orientation, the semiconductor wafer that contains the semiconductor substrate 801 is non-rotated, the first sidewall 891 with the planar contour is aligned so that it is parallel to <110> crystal directions and the second sidewall 892 with the saw-tooth contour is aligned so that it has edges, which form peaks, that are parallel to <100> crystal directions, then a crystallographic wet etch process using a hydroxide (OH)-based chemical could be performed. In this case, the first semiconductor material at the second sidewall 892 will etch at the faster etch rate (i.e., the first rate) as compared the first semiconductor material at the first sidewall 891 such that, after the crystallographic wet etch process, the portion of the first sidewall within the semiconductor substrate will be a {111}-oriented sidewall and the portion of the second sidewall within the semiconductor substrate will be a {110}-oriented sidewall. Thus, as illustrated in FIG. 14, the first side 807 of the asymmetric trench 812 will have a {110}-orientation and the second side 808 of the asymmetric trench 812 will have a {111}-orientation.

Similarly, if, as described above and illustrated in FIG. 12B, the semiconductor substrate 801 has a [100] surface orientation, the semiconductor wafer that contains the semiconductor substrate 801 is 45° rotated, the first sidewall 891 with the planar contour is aligned so that it is parallel to <100> crystal directions and the second sidewall 892 with the saw-tooth contour is aligned so that it has edges, which form peaks, that are parallel to <110> crystal directions, then the same crystallographic wet etch process using a hydroxide (OH)-based chemical could be performed. In this case, however, the first semiconductor material at the first sidewall 891 will etch at the faster etch rate (i.e., the first rate) as compared the first semiconductor material at the second sidewall 892 such that, after the crystallographic wet etch process, the portion of the first sidewall within the semiconductor substrate will be an {110}-oriented sidewall and the portion of the second sidewall within the semiconductor substrate will be a {111}-oriented sidewall. This will result in the same asymmetric trench 812 as illustrated in FIG. 14, with the first side 807 of the asymmetric trench 812 having a {110}-orientation and the second side 808 of the asymmetric trench 812 having a {111}-orientation.

Those skilled in the art will recognize that, in any case, the {110}-oriented first side 807 of the asymmetric trench 812 will have a first angle 809 of approximately 45° with respect to the [100] surface orientation of the semiconductor substrate 801 and the {111}-oriented second side 808 will have a second angle 810 that is approximately 54.7° with respect to the [100] surface orientation of the semiconductor substrate 801.

Figure 15:
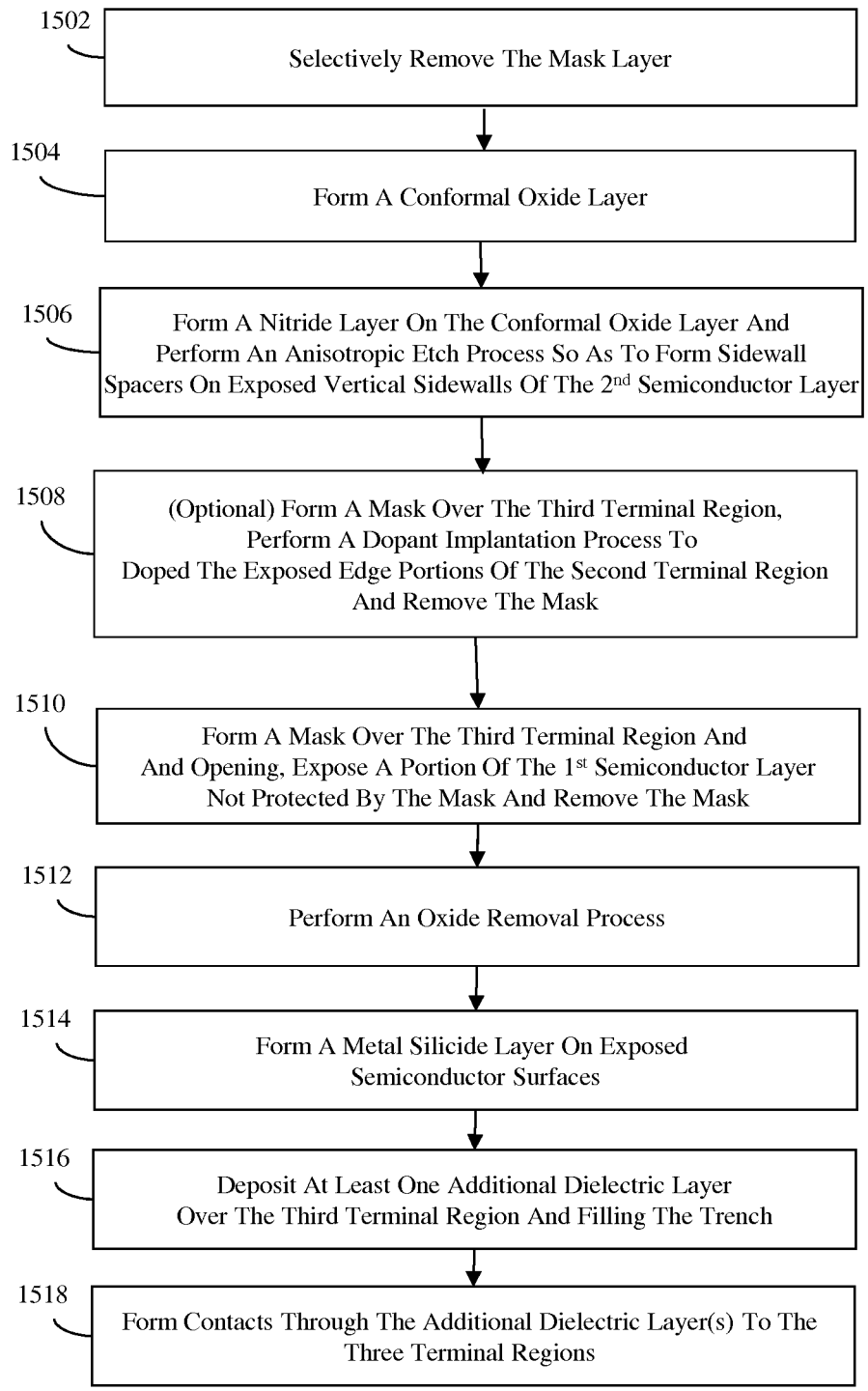
FIG. 15 is a flow diagram describing in greater detail exemplary additional process steps 714 of FIG. 7.

After the asymmetric trench 812 is formed, additional processing steps can be performed in order to complete the bipolar semiconductor device structure, which includes an asymmetric trench isolation region (714). FIG. 15 is a flow diagram describing in greater detail exemplary additional process steps 714 that can be performed in order to complete a bipolar semiconductor device structure.

Figure 16:
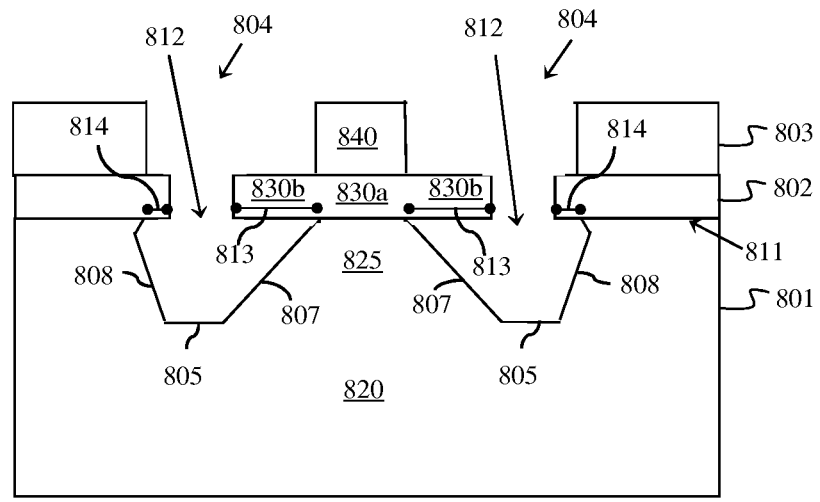
FIG. 16 is a cross-section diagram illustrating a partially completed bipolar semiconductor device formed according to the flow diagrams of FIGS. 7 and 15.
Figure 17:
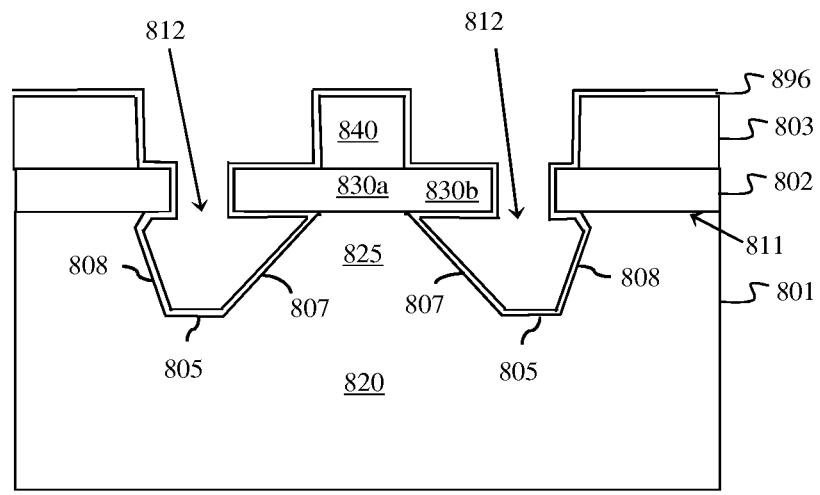
FIG. 17 is a cross-section diagram illustrating a partially completed bipolar semiconductor device formed according to the flow diagrams of FIGS. 7 and 15.

Specifically, the mask layer can be selectively removed (1502, see FIG. 16). For example, a reactive ion etch process can be used to etch a silicon nitride mask layer selectively over the semiconductor material of the second semiconductor layer 803, first semiconductor layer 802 and semiconductor substrate 801. Next, a conformal oxide layer 896 (e.g., a silicon dioxide layer) can be formed (e.g., by thermal oxidation or chemical vapor deposition (CVD)) over the partially completed structure and lining the trench 812 so as to passivize the exposed semiconductor surfaces of the semiconductor substrate 801, first semiconductor layer 802 and second semiconductor layer 803 (1504, see FIG. 17).

Figure 18:
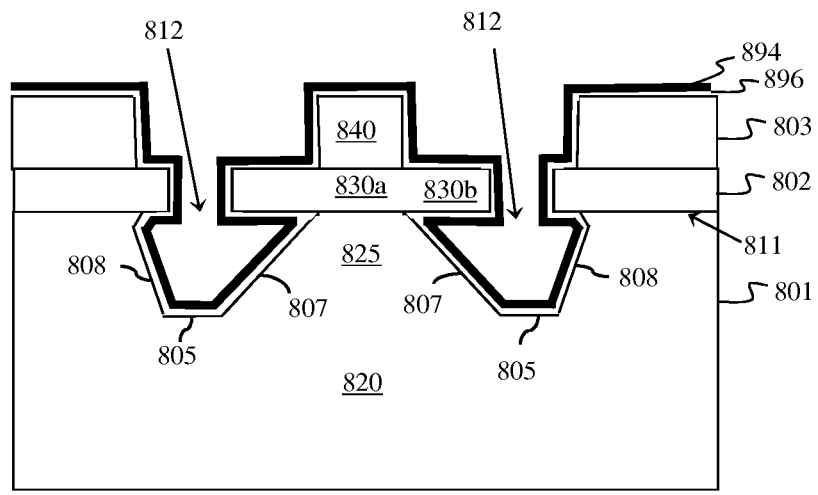
FIG. 18 is a cross-section diagram illustrating a partially completed bipolar semiconductor device formed according to the flow diagrams of FIGS. 7 and 15.
Figure 19:
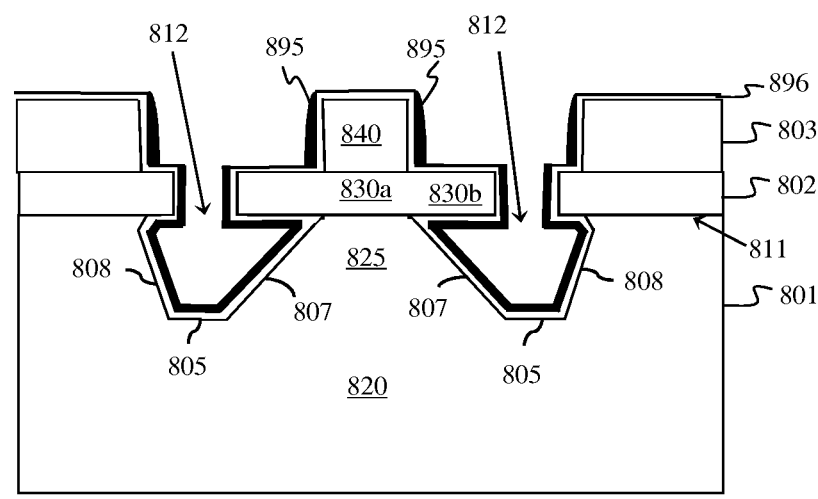
FIG. 19 is a cross-section diagram illustrating a partially completed bipolar semiconductor device formed according to the flow diagrams of FIGS. 7 and 15.

After the conformal oxide layer 896 is formed at process 1504, dielectric sidewall spacers 895 can be formed on the exposed sidewalls of the second semiconductor layer 803 using conventional sidewall spacer formation techniques (1506, see FIGS. 18-19). For example, to form the dielectric sidewall spacers 895, a conformal silicon nitride layer 894 can be deposited (e.g., by chemical vapor deposition (CVD) or plasma-enhanced chemical vapor deposition (PECVD)) on the conformal oxide layer 896 (see FIG. 18). Then, an anisotropic etch process can be performed so as to expose the horizontal surfaces of the conformal oxide layer 896 particularly on the first semiconductor layer 802 and second semiconductor layer 803, thereby forming the sidewall spacers 895 (see FIG. 19).

Optionally, a mask can be formed (e.g., lithographically patterned and etched) over the third terminal region 840 only such that the extrinsic base portion 830b of the base region 830 is exposed. Then, a dopant implantation process can be performed so as to alter the doping profile of the extrinsic base portion 830b as compared to the intrinsic base portion 830a (1508). For example, this extrinsic base portion 830b can be implanted with a first type conductivity dopant (e.g., a P-type dopant) such that it has the first type conductivity (e.g., P-type conductivity) a relatively high first type conductivity level as compared to the intrinsic base portion 830a and/or the semiconductor substrate 801. After the dopant implantation process is performed this mask can be removed.

Figure 20:
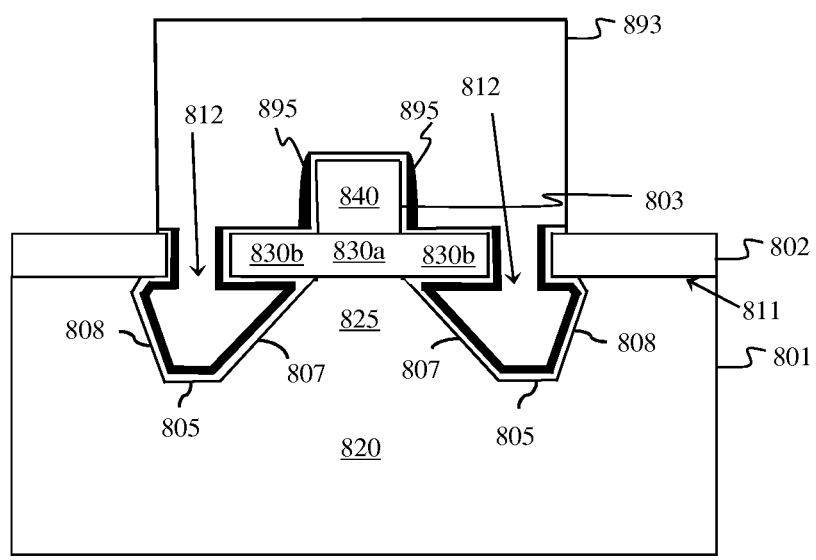
FIG. 20 is a cross-section diagram illustrating a partially completed bipolar semiconductor device formed according to the flow diagrams of FIGS. 7 and 15.
Figure 21:
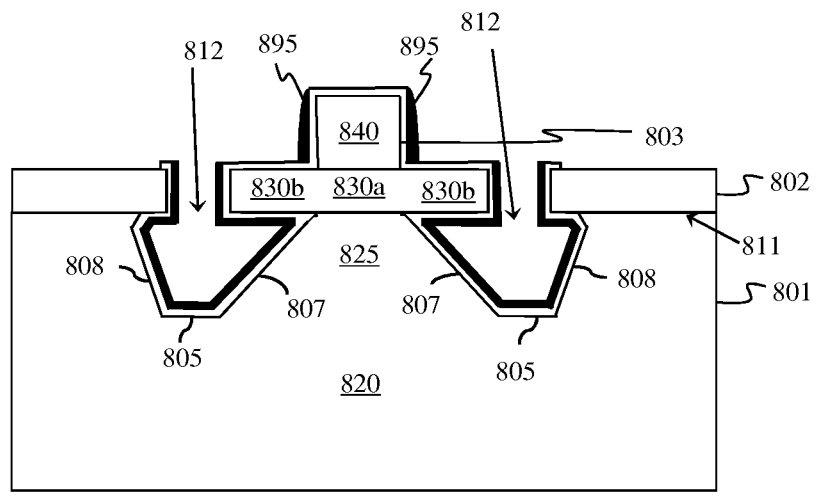
FIG. 21 is a cross-section diagram illustrating a partially completed bipolar semiconductor device formed according to the flow diagrams of FIGS. 7 and 15.

Then, a mask 893 can be formed (e.g., lithographically patterned and etched) that covers the third terminal region 840 and further extends laterally beyond the opening for the trench 812 (e.g., to approximately the outer edge of the trench 812). Once the mask 893 is formed, a portion of the first semiconductor layer 802 not protected by the mask 893 can be exposed (e.g., using a non-selective reactive ion etch process) and the mask 893 can be removed (1510, see FIGS. 20-21). This exposed portion of the first semiconductor layer 802 can subsequently be the site for formation at process 1518 (see detailed discussion below) of a contact to the first terminal region 820.

Figure 22:
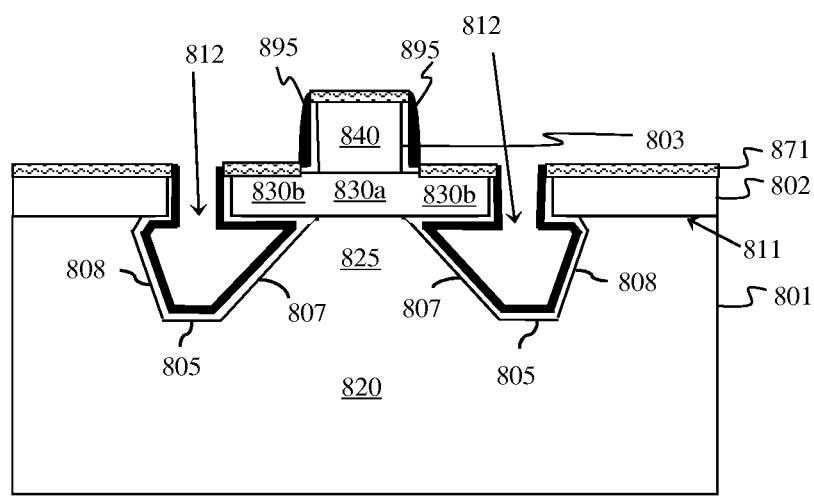
FIG. 22 is a cross-section diagram illustrating a partially completed bipolar semiconductor device formed according to the flow diagrams of FIGS. 7 and 15.

Next, an oxide removal process can be performed (e.g., using a conventional aqueous hydrofluoric acid (HF) solution or a chemical oxide removal (COR) process) to clean the exposed horizontal surfaces of the first semiconductor layer 802 and second semiconductor layer 803 (1512). Following this oxide removal process 1512, a metal silicide layer 871 can be formed on the exposed horizontal surfaces of the first semiconductor layer 802 and second semiconductor layer 803 (1514, see FIG. 22). The metal silicide layer 871 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. Techniques for forming a metal silicide layer are well known in the art and, thus, the details of these techniques are omitted from this specification in order to allow the reader to focus on the salient aspects of the disclosed method.

Subsequently, one or more additional dielectric layer(s) 870 can be formed so as to blanket the structure, covering the third terminal region 840, filling the asymmetric trench 812 within the semiconductor substrate 801 (i.e., completing the asymmetric trench isolation structure 890) and also filling the opening 804 within the first semiconductor layer 802 (1516, see FIG. 23). These additional dielectric layer(s) 870 can comprise, for example, any suitable interlayer dielectric material(s). For example, the additional dielectric layer(s) 870 can comprise any of silicon oxide ($SiO_x$), silicon nitride ($SiN_x$), borophosphosilicate glass (BPSG), etc. Finally, contacts 889 can be formed that extend vertically through the dielectric layer(s) 870 in order to contact the three terminals 820, 830 and 840 (e.g., the collector region, the extrinsic base portion of the base region and the emitter region), thereby completing the bipolar semiconductor device 800 (1518, see FIG. 23). Techniques for forming such additional dielectric layer(s) and contacts are well known in the art and, thus, the details of these techniques are omitted from this specification in order to allow the reader to focus on the salient aspects of the disclosed method.

It should be noted that in the method described the bipolar semiconductor device 800 is formed so as to have an emitter-up configuration (i.e., a configuration where the first terminal region 820 is the collector region, the second terminal region 830 is the base region and the third terminal region 840 is the emitter region). In such a bipolar semiconductor device, the asymmetry of the trench 812 ensures that the trench isolation region 890 has a relatively narrow width and, thereby ensures that both collector-to-base capacitance $C_{cb}$ and collector resistance $R_c$ within the resulting bipolar semiconductor device are minimized.

It should, however, be understood that, alternatively, this bipolar semiconductor device 800 can be formed so as to have a collector-up configuration (i.e., a configuration where the first terminal region 820 is the emitter region, the second terminal region 830 is the base region and the third terminal region 840 is the collector region). In such a bipolar semiconductor device, the asymmetry of the trench 812 ensures that the trench isolation region has a relatively narrow width and, thereby would ensures that both emitter-to-base capacitance $C_{eb}$ and emitter resistance $R_e$ within the resulting bipolar semiconductor device are minimized.

Figure 23:
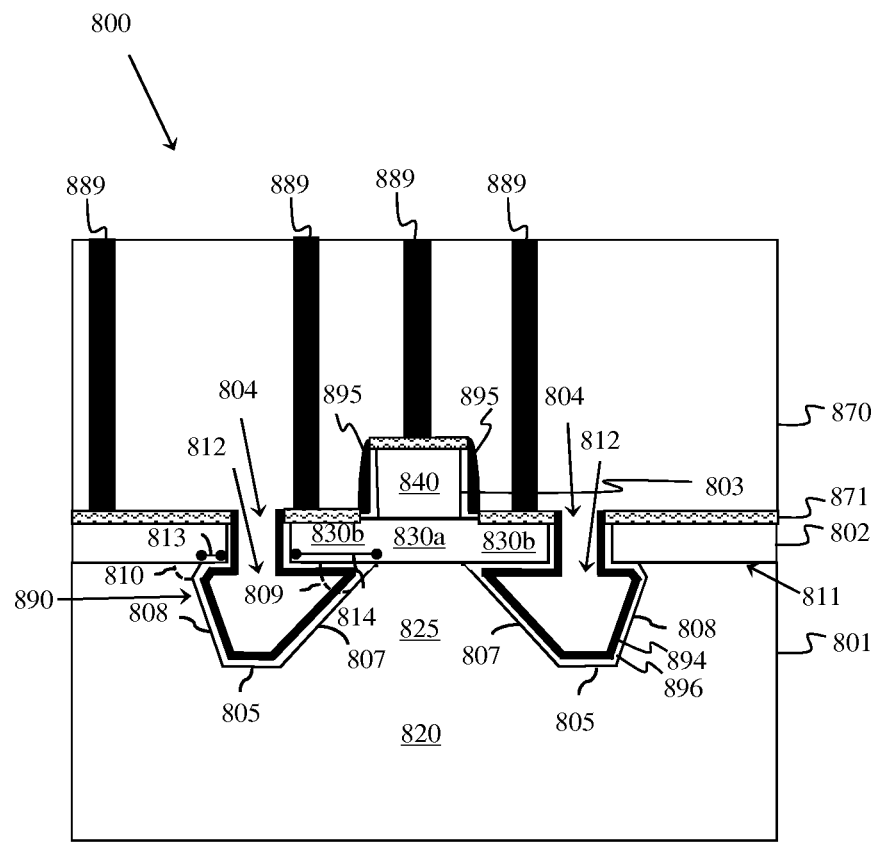
FIG. 23 is a cross-section diagram illustrating a completed bipolar semiconductor device formed according to the flow diagrams of FIGS. 7 and 15.

Referring to FIG. 23, also disclosed herein is a bipolar semiconductor device 800, such as a bipolar junction transistor (BJT) or heterojunction bipolar transistor (HBT), formed according to the method described above. Specifically, this bipolar semiconductor device 800 can comprise a semiconductor substrate 801 having a top surface 811 and a first terminal region 820 (e.g., a collector region) in the semiconductor substrate 801. This semiconductor substrate 801 can comprise a bulk semiconductor substrate, as illustrated in FIG. 23. Alternatively, the semiconductor substrate 801 can comprise a semiconductor-on-insulator (SOI) wafer (not shown). In any case, the semiconductor substrate 801 (or in the case of an SOI wafer, the top semiconductor layer of the SOI wafer) can comprise a first semiconductor material (e.g., monocrystalline silicon or any other suitable semiconductor material) having a first type conductivity (e.g., a P-type conductivity). Thus, for example, the semiconductor substrate 801 can comprise a P-silicon substrate (i.e., a silicon substrate having a relatively low concentration of a P-type dopant). Additionally, the semiconductor substrate 801 can comprise a first terminal region 820 (e.g., a collector region). The first terminal region 820 can comprise, for example, a well region (e.g., a dopant implant region) having a second type conductivity that is different from the first type conductivity (e.g., such that it comprises an N-well region having an N-type conductivity).

The bipolar semiconductor device 800 can further comprise, on the top surface 811 of the semiconductor substrate 801, a first semiconductor layer 802 comprising a second terminal region 830. Specifically, the first semiconductor layer 802 can comprise a second semiconductor material that is different from the first semiconductor material. For example, if the first semiconductor material of the semiconductor substrate 801 comprises monocrystalline silicon, the second semiconductor material of the first semiconductor layer 802 can comprise silicon germanium, silicon carbide, or silicon germanium carbide. This first semiconductor layer 802 can comprise a second terminal region 830 (e.g., a base region) aligned above the first terminal region 820 within the semiconductor substrate 801. This base region 830 can comprise an intrinsic base region 830a and an extrinsic base portion 830b positioned laterally adjacent to and, particularly, laterally surrounding the intrinsic base portion 830a. The intrinsic base portion 830a can be undoped. Alternatively, this intrinsic base region can doped with a relatively low concentration of a first type conductivity dopant (e.g., a P-type dopant) and, thereby such that it has the same type conductivity as the semiconductor substrate 801 (e.g., P-type conductivity). Alternatively, this intrinsic base region 830a can be doped so that it has a relatively thin un-doped lower portion that it has neither N-type, nor P-type conductivity and an upper portion that is doped with a relatively low concentration of a first type conductivity dopant (e.g., a P-type dopant). The extrinsic base portion 830b can have the same doping profile as the intrinsic base portion 830a. Alternatively, the extrinsic base portion 830b can be doped with a relatively high concentration of a first type conductivity dopant (e.g., a P-type dopant) such that the extrinsic base portion 830b has the same conductivity type at a higher level than the semiconductor substrate 801 and/or the intrinsic base portion 830a.

The bipolar semiconductor device 800 can further comprise a second semiconductor layer 803 on the first semiconductor layer 802 aligned above base region 830. This second semiconductor layer 803 can comprise a third terminal region 840 (e.g., an emitter region) and can be narrower than the base region 830 such that the third terminal region is vertically aligned above only the intrinsic base portion 830a of that base region 830 (i.e., such that the extrinsic base portion 830b extends laterally beyond the third terminal region 840). This second semiconductor layer 803 can comprise, for example, the same first semiconductor material as the semiconductor substrate 801. The third terminal region 840 can be doped with a second type conductivity dopant (e.g., an N-type dopant) and, thereby such that it has the same type conductivity as the first terminal region 820 within the semiconductor substrate 801 (e.g., N-type conductivity).

One or more sidewall spacers 895 can be positioned laterally adjacent to vertical sidewalls of the third terminal region 840. These sidewall spacer(s) 895 can comprise, for example, a first sidewall spacer (e.g., a silicon dioxide sidewall spacer) immediately adjacent to the third terminal region 840 and a second sidewall spacer (e.g., a silicon nitride sidewall spacer) positioned laterally adjacent to the first sidewall spacer.

The bipolar semiconductor device 800 can further comprise a metal silicide layer 871 on top surface of the second semiconductor layer 803 and, particularly, the third terminal region 840 and on the top surface of the first semiconductor layer 802 such that the metal silicide layer 871 is positioned laterally adjacent to the sidewall spacers 895. This metal silicide layer 871 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof.

The bipolar semiconductor device 800 can further comprise an opening 804, which extends vertically through the metal silicide layer 871 and first semiconductor layer 802 and which is further positioned laterally adjacent to the second terminal region 830. Specifically, this opening 804 can laterally surround and, thereby define the limits of the second terminal region 830.

The bipolar semiconductor device 800 can further comprise an asymmetric trench isolation region 890. This asymmetric trench isolation region 890 can comprise an asymmetric trench 812, which is in the semiconductor substrate 801 aligned below the opening 804. This asymmetric trench 812 can define and, particularly, can laterally surround a relatively narrow portion of the first terminal region 820 (i.e., a first terminal pedestal region 825, for example, a collector pedestal region) at the top surface of the semiconductor substrate 801 aligned below the second terminal region 830 (e.g., the base region).

The asymmetric trench 812 can have a bottom surface 805 some distance from the top surface 811 of the semiconductor substrate 801 and opposing sides 807-808. The opposing sides 807-808 can have different angles 809-810, respectively, relative to the top surface 811 of the semiconductor substrate 801 and can undercut the first semiconductor layer 802 on either side of the opening 804 by different distances 813-814, respectively. That is, the asymmetric trench 812 can have a first side 807 positioned laterally adjacent to the first terminal pedestal region 825 (e.g., adjacent to the collector pedestal region) and a second side 808 opposite the first side 807. The first side 807 can have a first angle 809 and first crystal orientation relative to the top surface 811 of the semiconductor substrate. The second side 808 can have a second angle 810 and second crystal orientation relative to the top surface 811 of the semiconductor substrate 801. The first and second crystal orientations can be different such that the first and second angles are different, for example, such that the second angle 810 is larger than the first angle 809. For example, the first side 807 can be {110}-oriented such that has a first angle 809 of approximately 45° with respect to the [100] surface orientation of the semiconductor substrate 801 and the second side 808 can be {111}-oriented such that has a second angle 810 that is approximately 54.7° with respect to the [100] surface orientation of the semiconductor substrate 801.

Additionally, the first side 807 can undercut the first semiconductor layer 802 and, particularly, the extrinsic base portions 830b of the base region 830 on one side of the opening 804 by a first distance 813 (e.g., of approximately 0.4 μm) and the second side 808 can undercut the first semiconductor layer 802 on the opposite side of the opening 804 by a second distance 814 that is less than the first distance 813 (e.g., by 0.2 μm or less).

Additionally, the asymmetric trench isolation region 890 can comprise one or more isolation materials that fill the asymmetric trench 812. The isolation material(s) can also fill the opening 804 in the first semiconductor layer 902 above the trench 912. For example, the trench 812 and opening 804 can be lined with a relatively thin silicon dioxide layer 896. A relatively thin silicon nitride layer 894 can cover the silicon dioxide layer and one or more additional dielectric layer(s) 870 (e.g., a borophosphosilicate glass (BPSG) or other suitable dielectric layer) can fill the remaining portions of the trench 812 and opening 804. The additional dielectric layer(s) 870 can further cover the metal silicide layer 871 and contacts 889 can extend vertically through the additional dielectric layer(s) 870 to contact the three terminal regions 820, 830, and 840 (e.g., the collector region, the extrinsic base portion of the base region and the emitter region) of the bipolar semiconductor device 800.

It should be noted that the bipolar semiconductor device 800, as described above, has an emitter-up configuration (i.e., a configuration where the first terminal region 820 is the collector region, the second terminal region 830 is the base region and the third terminal region 840 is the emitter region). In such a bipolar semiconductor device, the asymmetry of the trench 812 ensures that the trench isolation region 890 has a relatively narrow width and, thereby ensures that both collector-to-base capacitance $C_{cb}$ and collector resistance $R_c$ within the resulting bipolar semiconductor device are minimized. It should, however, be understood that, alternatively, this bipolar semiconductor device 800 can have a collector-up configuration (i.e., a configuration where the first terminal region 820 is the emitter region, the second terminal region 830 is the base region and the third terminal region 840 is the collector region). In such a bipolar semiconductor device, the asymmetry of the trench 812 ensures that the trench isolation region has a relatively narrow width and, thereby would ensures that both emitter-to-base capacitance $C_{eb}$ and emitter resistance $R_e$ within the resulting bipolar semiconductor device are minimized.

It should further be noted that in the methods and bipolar semiconductor device structures described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having a N-type conductivity is typically doped with silicon (Si). Those skilled in the art will also recognize that different conductivity levels will depend upon the relative concentration levels of the dopants.

It should further be noted that the terminology used herein is for the purpose of describing the system, method and computer program product and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is an improved technique for forming an asymmetric trench for an asymmetric trench structure (e.g., for an asymmetric trench isolation region) within a semiconductor substrate aligned below an opening in a semiconductor layer. With this technique, the opening is patterned in a mask layer so as to have a first sidewall with planar contour and a second sidewall with a saw-tooth contour. An etch process extends the opening through the semiconductor layer and into the semiconductor substrate. Then, another etch process (e.g., a crystallographic etch process) expands the lower portion of the opening within the semiconductor substrate, thereby forming a trench. Due to the different contours of the first and second sidewalls and, thereby the different crystal orientations of the semiconductor material exposed at the first and second sidewalls, the crystallographic etch process etches one sidewall faster than the other, resulting in an asymmetric trench. Also disclosed herein is a method of forming a semiconductor device and, particularly, a bipolar semiconductor device, such as a bipolar junction transistor (BJT) or heterojunction bipolar transistor (HBT). This method incorporates the above-mentioned asymmetric trench formation technique when forming a trench isolation region that undercuts an extrinsic base region and surrounds a collector pedestal. The asymmetry of the trench ensures that the trench isolation region has a relatively narrow width and, thereby ensures that both collector-to-base capacitance $C_{cb}$ and collector resistance $R_c$ within the resulting bipolar semiconductor device are minimized.

What is claimed is:

1. A bipolar semiconductor device comprising:
    a first terminal region in a semiconductor substrate, said semiconductor substrate having a top surface;
    a second terminal region in a first semiconductor layer on said top surface of said semiconductor substrate, said second terminal region being aligned above said first terminal region;
    a third terminal region in a second semiconductor layer on said first semiconductor layer, said third terminal region being aligned above said second terminal region;
    an opening extending vertically through said first semiconductor layer and positioned laterally adjacent to said second terminal region;
    an asymmetric trench in said semiconductor substrate aligned below said opening, said asymmetric trench having a first side adjacent to said first terminal region and a second side opposite said first side, said first side having a first angle relative to said top surface and said second side having a second angle relative to said top surface, said second angle being larger than said first angle; and,
    at least one isolation material filling said trench so as to form an asymmetric trench isolation region, said at least one isolation material also filling said opening.

2. The bipolar semiconductor device of claim 1, said first side being separated from said opening at said a top surface of said semiconductor substrate by a first distance, said second side being separated from said opening at said top surface of said semiconductor substrate by a second distance, said first distance being greater than said second distance.

3. The bipolar semiconductor device of claim 1, said semiconductor substrate and said second semiconductor layer comprising a first semiconductor material and said first semiconductor layer comprising a second semiconductor material different from said first semiconductor material.

4. The bipolar semiconductor device of claim 3, said first semiconductor material comprising monocrystalline silicon and said second semiconductor material comprising any of silicon germanium, silicon carbide and silicon germanium carbide.

5. The bipolar semiconductor device of claim 1, said first terminal region comprising a collector region, said second terminal region comprising a base region and said third terminal region comprising an emitter region.

6. The bipolar semiconductor device of claim 1, said at least one isolation material can comprise:
a silicon dioxide layer lining said asymmetric trench and said opening;
a silicon nitride layer on said silicon dioxide layer; and,
an additional dielectric layer on said silicon nitride layer filling said asymmetric trench and said opening.

7. A bipolar semiconductor device comprising:
a first terminal region in a semiconductor substrate, said semiconductor substrate having a top surface;
a second terminal region in a first semiconductor layer on said top surface of said semiconductor substrate, said second terminal region being aligned above said first terminal region;
a third terminal region in a second semiconductor layer on said first semiconductor layer, said third terminal region being aligned above said second terminal region;
an opening extending vertically through said first semiconductor layer and positioned laterally adjacent to said second terminal region;
an asymmetric trench in said semiconductor substrate aligned below said opening and laterally surrounding a pedestal region of said first terminal region at said top surface of said substrate, said asymmetric trench having a first side adjacent to said pedestal region and a second side opposite said first side, said first side having a first angle and a first crystal orientation relative to said top surface and said second side having a second angle and a second crystal orientation relative to said top surface, said first crystal orientation and said second crystal orientation being different such that said second angle is larger than said first angle; and,
at least one isolation material filling said trench so as to form an asymmetric trench isolation region, said at least one isolation material also filling said opening.

8. The bipolar semiconductor device of claim 7, said first side being separated from said opening at said top surface of said semiconductor substrate by a first distance, said second side being separated from said opening at said top surface of said semiconductor substrate by a second distance, said first distance being greater than said second distance.

9. The bipolar semiconductor device of claim 7, said semiconductor substrate and said second semiconductor layer comprising a first semiconductor material and said first semiconductor layer comprising a second semiconductor material different from said first semiconductor material.

10. The bipolar semiconductor device of claim 9, said first semiconductor material comprising monocrystalline silicon and said second semiconductor material comprising any of silicon germanium, silicon carbide and silicon germanium carbide.

11. The bipolar semiconductor device of claim 7, said first terminal region comprising a collector region, said second terminal region comprising a base region and said third terminal region comprising an emitter region.

12. The bipolar semiconductor device of claim 7, said at least one isolation material can comprise:
a silicon dioxide layer lining said asymmetric trench and said opening;
a silicon nitride layer on said silicon dioxide layer; and,
an additional dielectric layer on said silicon nitride layer filling said asymmetric trench and said opening.

13. A bipolar semiconductor device comprising:
a semiconductor substrate having a top surface with a [100] surface orientation;
a collector region in a semiconductor substrate, said collector region comprising a pedestal region at said top surface and a lower portion below said pedestal region, said pedestal region being narrower than said lower portion;
a base region in a first semiconductor layer on said top surface of said semiconductor substrate, said base region comprising an intrinsic base region aligned above said collector region and an extrinsic base region laterally surrounding said intrinsic base region;
an emitter region in a second semiconductor layer on said first semiconductor layer, said emitter region being aligned above said intrinsic base region;
an opening extending vertically through said first semiconductor layer and laterally surrounding said base region;
an asymmetric trench in said semiconductor substrate aligned below said opening and laterally surrounding said pedestal region, said asymmetric trench having a first side adjacent to said pedestal region and a second side opposite said first side, said first side having a {110} crystal orientation relative to said top surface and said second side having a {111} crystal orientation relative to said top surface; and,
at least one isolation material filling said trench so as to form an asymmetric trench isolation region, said at least one isolation material also filling said opening.

14. The bipolar semiconductor device of claim 13, said first side having a first angle of approximately 45° relative to said top surface of said semiconductor substrate and said second side having a second angle of approximately 54.7° relative to said top surface of said semiconductor substrate.

15. The bipolar semiconductor device of claim 13, said first side being separated from said opening at said top surface of said semiconductor substrate by a first distance so as to undercut said extrinsic base region, said second side being separated from said opening at said top surface of said semiconductor substrate by a second distance, said first distance being greater than said second distance.

16. The bipolar semiconductor device of claim 15, said first distance being approximately twice said second distance.

17. The bipolar semiconductor device of claim 15, said first distance being approximately 0.4 μm and said second distance being approximate 0.2 μm.

18. The bipolar semiconductor device of claim 13, said semiconductor substrate and said second semiconductor layer comprising a first semiconductor material and said first semiconductor layer comprising a second semiconductor material different from said first semiconductor material.

19. The bipolar semiconductor device of claim 18, said first semiconductor material comprising monocrystalline silicon and said second semiconductor material comprising any of silicon germanium, silicon carbide and silicon germanium carbide.

20. The bipolar semiconductor device of claim 13, said at least one isolation material can comprise:
a silicon dioxide layer lining said asymmetric trench and said opening;
a silicon nitride layer on said silicon dioxide layer; and,
an additional dielectric layer on said silicon nitride layer filling said asymmetric trench and said opening.

* * * * *